United States Patent [19]
Hidaka

[11] Patent Number: 5,933,377
[45] Date of Patent: Aug. 3, 1999

[54] SEMICONDUCTOR MEMORY DEVICE AND DEFECT REPAIR METHOD FOR SEMICONDUCTOR MEMORY DEVICE

[75] Inventor: Hideto Hidaka, Tokyo, Japan

[73] Assignee: Mitsubishi Denki Kabushiki Kaisha, Tokyo, Japan

[21] Appl. No.: 08/915,270

[22] Filed: Aug. 20, 1997

[30] Foreign Application Priority Data

Mar. 25, 1997 [JP] Japan ................................ 9-071421

[51] Int. Cl.⁶ .............................................. G11C 7/00
[52] U.S. Cl. ...................................... 365/200; 365/222
[58] Field of Search .................................. 365/200, 201, 365/222, 230.03

[56] References Cited

U.S. PATENT DOCUMENTS

| | | | |
|---|---|---|---|
| 5,297,102 | 3/1994 | Tanizaki | 365/230.03 |
| 5,329,490 | 7/1994 | Murotani | 365/222 |
| 5,355,339 | 10/1994 | Oh et al. | 365/200 |
| 5,392,247 | 2/1995 | Fujita | 365/200 |
| 5,491,664 | 2/1996 | Phelan | 365/200 |
| 5,517,450 | 5/1996 | Ohsawa | 365/200 |
| 5,574,729 | 11/1996 | Kinoshita et al. | 371/10.3 |

FOREIGN PATENT DOCUMENTS

| | | |
|---|---|---|
| 2-310898 | 12/1990 | Japan . |
| 3-1397 | 1/1991 | Japan . |
| 4-68719 | 11/1992 | Japan . |
| 5-101651 | 4/1993 | Japan . |

*Primary Examiner*—Son Mai
*Attorney, Agent, or Firm*—Oblon, Spivak, McClelland, Maier & Neustadt, P.C.

[57] ABSTRACT

In a semiconductor memory device, rows of normal cell array blocks are selected by 13-bit row addresses corresponding to a refresh period of 8 kc respectively, so that the selected rows are successively refreshed. A spare memory array block is selected by a 12-bit row address for 4 kc excluding the most significant row address in the 13-bit row addresses corresponding to the row addresses of 8 kc. Thus, the semiconductor memory device can effectively carry out defect repair without reducing the yield also when a spare memory cell is inferior in data retention ability.

9 Claims, 27 Drawing Sheets

SEMICONDUCTOR MEMORY DEVICE AND DEFECT REPAIR METHOD FOR SEMICONDUCTOR MEMORY DEVICE

BACKGROUND OF THE INVENTION

1. Field of the Invention

The present invention relates to a semiconductor memory device and a defect repair method for a semiconductor memory device, and more particularly, it relates to a redundant structure for defect repair in a semiconductor memory device and a structure for simplifying a test therefor.

2. Description of the Background Art

FIG. 28 is an explanatory diagram schematically showing the structure of a conventional dynamic semiconductor memory device (DRAM) having a plurality of dynamic memory cells. As shown in FIG. 28, a memory cell array 10 is divided into a plurality of (eight in FIG. 28) normal cell array blocks BLK1 to BLK8. Sense amplifier zones SRi and SR(i+1) formed with sense amplifiers (not shown) are provided on both sides (vertical direction in FIG. 28) of each normal cell array block BLKi (i=1 to 8), and each sense amplifier zone SRj (j=2 to 8) is shared by normal cell array blocks BLK(j-1) and BLKj.

A column decoder CD is provided for the memory cell array 10, and row decoders RD1 to RD8 are provided for the normal cell array blocks BLK1 to BLK8 respectively. Each normal cell array block BLKi (i=1 to 8) is provided therein with memory cells (not shown in FIG. 28) which are arranged in the form of a matrix, word lines (not shown) for selecting rows of the memory cells, and bit lines (not shown) for reading/writing data from/in the memory cells.

FIG. 29 is an explanatory diagram for illustrating a redundant structure for defect repair in the aforementioned dynamic semiconductor memory device. As shown in FIG. 29, a memory cell array 1 further comprises a spare cell array block SBLK which is identical or similar to each normal cell array block BLKi and a row decoder SRD1 for the spare cell array block SBLK. Referring to FIG. 29, the sense amplifier zones SR1 to SR9 and the column decoder CD shown in FIG. 28 are omitted for convenience of illustration.

When a memory cell provided in any block BLKp (p=any of 1 to 8) includes a defect in the aforementioned structure, the defective normal cell array block BLKp is electrically replaced with the spare cell array block SBLK by a laser fuse program system or the like, for repairing the defect.

FIG. 30 is an explanatory diagram showing another exemplary redundant structure for defect repair in relation to the dynamic semiconductor memory device. As shown in FIG. 30, a memory cell array 2 consists of a normal cell array 3 having generally used memory cells, and spare row and column cell arrays 4 and 5 having memory cells for defect repair of the normal cell array 3.

The spare row and column cell arrays 4 and 5 have spare memory cells provided on a spare row and a spare column respectively, and the spare memory cells of the spare row and column arrays 4 and 5 are formed on the same column and row as the memory cell columns and rows of the normal cell array 2 respectively.

When any memory cell provided in the normal cell array 2 includes a defect in the aforementioned structure, the defective memory cell is electrically replaced with a memory cell provided on the spare row or column of the spare row or column cell array 4 or 5 by the laser fuse program system or the like, for repairing the defect.

In the conventional dynamic semiconductor memory device having the aforementioned structure, the defect cannot be effectively repaired by a general hard error defect repair system if the spare cell array block SBLK or the spare row or column cell array 4 or 5 includes a memory cell having inferior data holdability (data retention ability).

While the data retention ability of the spare row or column array 4 or 5 or the spare cell array block SBLK may be tested for thereafter repairing the defect in order to solved the aforementioned problem, the time for the data retention ability test is so long that the capacity of a fail memory of a test circuit necessary for storing defect repair information is disadvantageously increased. Thus, this method is impractical.

SUMMARY OF THE INVENTION

According to a first aspect of the present invention, a semiconductor memory device comprises a memory cell array having a plurality of dynamic memory cells, and memory cell access means accessing the plurality of memory cells on the basis of address signals respectively in a refresh operation, and the memory cell access means is accessible to the plurality of memory cells at a plurality of refresh intervals in the refresh operation.

According to a second aspect of the present invention, the memory access means is capable of accessing part of the plurality of memory cells at a refresh interval which is different from the remaining ones.

According to a third aspect of the present invention, the memory cell access means accesses all of the plurality of memory cells under the same conditions in an operation other than the refresh operation.

According to a fourth aspect of the present invention, the plurality of memory cells have a plurality of normal memory cells and a plurality of spare memory cells, and the memory cell access means is capable of replacing part of the plurality of normal memory cells with a replacement access spare memory cell group which is at least part of the plurality of spare memory cells and accessing the same, for accessing the plurality of normal memory cells at a first refresh interval while accessing memory cells of the replacement access spare memory cell group at a second refresh interval which is shorter than the first refresh interval in a refresh operation after the replacement.

According to a fifth aspect of the present invention, the memory cell array incudes a plurality of normal cell array blocks each formed by dividing the plurality of normal memory cells and at least one spare cell array block which is formed by the plurality of spare memory cells, and the memory cell access means accesses one block of at least one spare cell array block as the replacement access spare memory cell group in place of a block having a defective normal memory cell among the plurality of normal cell array blocks.

According to a sixth aspect of the present invention, the memory cell array incudes a plurality of normal cell array blocks each formed by dividing the plurality of normal memory cells and at least one spare cell array block which is formed by the plurality of spare memory cells, and the memory cell access means accesses a memory cell group of a row or column of one block of at least one spare cell array block in place of a memory cell group of a row or column having a defective normal memory cell among the plurality of normal cell array blocks.

According to a seventh aspect of the present invention, the second refresh interval includes a plurality of types of second refresh intervals which are different in time from each other, and the memory cell access means makes access at one of the plurality of second refresh intervals on the basis of a control signal in the refresh operation.

According to an eighth aspect of the present invention, the memory cell access means receives an external control signal in the refresh operation for accessing all of the plurality of memory cells at a refresh interval which is decided on the basis of the external control signal among the plurality of refresh intervals.

According to a ninth aspect of the present invention, the memory cell access means accesses memory cells excluding part of the plurality of memory cells as an accessed memory cell group, for accessing partial memory cells of the accessed memory cell group at a refresh interval which is different from the remaining ones.

According to a tenth aspect of the present invention, the memory cell access means accesses all of the plurality of memory cells as an accessed memory cell group, for accessing partial memory cells of the accessed memory cell group at a refresh interval which is different from the remaining ones.

According to an eleventh aspect of the present invention, a semiconductor memory device comprises a memory cell array having a plurality of cell blocks each formed by dividing a plurality of memory cells so that adjacent ones of the plurality of cell array blocks share sense amplifiers, and block access means accessing those of the plurality of cell array blocks excluding an initial unused block group as an accessed block group in an initial state while accessing a block in the initial unused block group having no possibility of competitively using the shared sense amplifier after replacement in place of a defective block having a defective memory cell which is included in the accessed block group.

According to a twelfth aspect of the present invention, the plurality of memory cells include a plurality of normal memory cells and a plurality of spare memory cells, the plurality of cell array blocks include first and second spare cell array blocks formed by dividing the plurality of spare memory cells and a plurality of normal cell blocks each formed by dividing the plurality of normal memory cells, the accessed block group includes the plurality of normal cell array blocks, the initial unused block group includes the first and second spare cell array blocks, each of the first and second spare cell blocks share a sense amplifier with at least one block among the plurality of normal cell array blocks, and the block access means accesses one of the first and second spare cell array blocks having no possibility of competitively using the shared sense amplifier after replacement in place of a defective block having a defective normal memory cell among the plurality of normal cell array blocks.

According to a thirteenth aspect of the present invention, the memory cell array has first and second partial memory cell arrays, the plurality of normal cell array blocks have a plurality of first normal cell array blocks and a plurality of second normal cell array blocks, the first partial memory cell array has the first spare cell array block and the plurality of first normal cell array blocks, the first spare cell array block shares a sense amplifier with at least one block among the plurality of first normal cell array blocks, the second partial memory cell array has the second spare cell array block and the plurality of second normal cell array blocks, the second spare cell array block shares a sense amplifier with at least one block among the plurality of second normal cell array blocks, and the block access means is previously set not to simultaneously access the plurality of first normal cell array blocks and the plurality of second normal cell array blocks, for accessing the second spare cell array block in place of a defective block having a defective normal memory cell among the plurality of first normal cell array blocks and accessing the first spare cell array block in place of a defective block having a defective normal memory cell among the plurality of second normal cell array blocks.

According to a fourteenth aspect of the present invention, the block access means reconstructs access conditions for an entire new accessed block group assuming that a block group excluding the defective block and including part of the initial unused block group as the new accessed block group when the defective block is present.

According to a fifteenth aspect of the present invention, a defect repair method for the semiconductor memory device according to the fifth aspect comprises the steps of (a) testing whether or not the defective block is present in the plurality of normal cell array blocks, (b) carrying out a defectiveness/ non-defectiveness test on at least one spare cell array block when presence of the defective block is confirmed in the test at the step (a), and (c) making change for accessing one block among at least one spare cell array block in place of the defective block and carrying out defect repair when a determination of non-defectiveness is made in the defectiveness/non-defectiveness test at the step (b).

According to a sixteenth aspect of the present invention, the defectiveness/non-defectiveness test at the step (b) includes a first test of determining non-defectiveness when no defective spare memory cell is present in at least one spare cell array block, and a second test of determining non-defectiveness when each spare memory cell of at least one spare cell array block has data retention ability refreshable at the second refresh interval.

According to a seventeenth aspect of the present invention, a defect repair method for the semiconductor memory device according to the twelfth aspect comprises the steps of (a) testing whether or not the defective block is present in the plurality of normal cell array blocks, (b) making a defectiveness/non-defectiveness test on the first and second spare cell array blocks when presence of the defective block is confirmed in the test at the step (a), and (c) making change for accessing one block among the first and second spare cell array blocks in place of the defective block and carrying out defect repair when a determination of non-defectiveness is made in the defectiveness/non-defectiveness test at the step (b).

According to an eighteenth aspect of the present invention, the semiconductor memory device is that according to the thirteenth aspect, the defectiveness/non-defectiveness test at the step (b) includes a test of determining non-defectiveness when no defective spare memory cell is present for a spare cell array block sharing no sense amplifier with the defective block among the first and second spare cell array blocks, and the change at the step (c) is change of accessing a block which is subjected to the defectiveness/non-defectiveness test at the step (b) among the first and second spare cell array blocks in place of the defective block.

As hereinabove described, the memory cell access means of the semiconductor memory device according to the first aspect of the present invention, which is accessible to the plurality of memory cells at the plurality of refresh intervals, can make access at refresh intervals responsive to the states of the plurality of memory cells.

The memory cell access means of the semiconductor memory device according to the second aspect of the present invention, which is capable of accessing part of the plurality of memory cells at the refresh interval different from the remaining ones in the refresh operation, can access a partial memory cell at a refresh interval specific thereto.

The memory cell access means of the semiconductor memory device according to the third aspect of the present invention, which accesses all of the plurality of memory cells under the same conditions in an operation other than the refresh operation, exerts no bad influence on a general read or write operation other than the refresh operation.

The memory cell access means of the semiconductor memory device according to the fourth aspect of the present invention accesses the plurality of normal memory cells at the first refresh interval while accessing the replacement access spare memory cell group at the second refresh interval which is shorter than the first refresh interval in the refresh operation after the replacement.

Therefore, the semiconductor memory device can normally make refresh operations even if memory cells in the replacement access spare memory cell group are slightly inferior in data retention ability (data holdability), by sufficiently shortening the second refresh interval.

The memory cell access means of the semiconductor memory device according to the fifth aspect of the present invention accesses one block of at least one spare cell array block in place of the block having a defective normal memory cell among the plurality of normal cell array blocks, whereby a normal operation can be performed even if the substitutional spare cell array block is slightly inferior in data retention ability by sufficiently shortening the second refresh interval.

The memory cell access means of the semiconductor memory device according to the sixth aspect of the present invention accesses the memory cell group of a row or column of one block of at least one spare cell array block in place of the memory cell group of the row or column having the defective normal memory cell among the plurality of normal cell array blocks, whereby a normal operation can be performed even if the memory cell group of the row or column of the substitutional spare cell array block is slightly inferior in data retention ability.

The memory cell access means of the semiconductor memory device according to the seventh aspect of the present invention makes access at one of the plurality of second refresh intervals on the basis of the control signal, whereby the refresh operation can be performed at a refresh interval most suitable to the data retention ability of the replacement access spare memory cell group.

The memory cell access means of the semiconductor memory device according to the eighth aspect of the present invention accesses all of the plurality of memory cells at the refresh interval decided on the basis of the external control signal, whereby a refresh operation can be performed in response to data retention ability of the plurality of memory cells.

The memory cell access means of the semiconductor memory device according to the ninth aspect of the present invention, which accesses partial memory cells in the accessed memory cell group at a refresh interval different from the remaining ones, can access the partial memory cells at a refresh interval specific thereto.

The memory cell access means of the semiconductor memory device according to the tenth aspect of the present invention, which accesses partial memory cells among the accessed memory cell group including all of the plurality of memory cells at a refresh interval different from the remaining ones, can access the partial memory cells at a refresh interval specific thereto.

Further, the memory cell access means accesses all of the plurality of memory cells, whereby the memory cells can be efficiently used.

The block access means of the semiconductor memory device according to the eleventh aspect of the present invention accesses the blocks of the initial unused block group having no possibility of competitively using the shared sense amplifier after replacement in place of the defective block, whereby no influence is exerted on an operation after block replacement even if a plurality of cell array blocks present a structure of sharing a sense amplifier between each adjacent pair of blocks, and the degree of integration can he improved by utilizing the sense amplifiers in a shared manner.

The block access means of the semiconductor memory device according to the twelfth aspect of the present invention accesses the blocks having no possibility of competitively using the shared sense amplifier after replacement among the first and second spare cell array blocks in place of the defective block having a defective normal memory cell among the plurality of normal cell array blocks, whereby no influence is exerted even if a sense amplifier is shared with at least one block among the plurality of normal cell array blocks, and the degree of integration can be improved by efficiently utilizing the sense amplifiers.

The block access means of the semiconductor memory device according to the thirteenth aspect of the present invention accesses the second spare cell array block in place of the defective block having a defective normal memory cell among the plurality of first normal cell array blocks while accessing the first spare cell array block in place of the defective block having a defective normal memory cell among the plurality of second normal cell array blocks, whereby it comes to that the first and second spare cell array blocks substitute for the normal cell array blocks of partial memory cell arrays different from themselves respectively, and neither first nor second spare cell array block competitively uses any sense amplifier after the replacement.

The block access means of the semiconductor memory device according to the fourteenth aspect of the present invention reconstructs access conditions for the entire new accessed block group assuming that the block group excluding the defective block and including part of the initial unused block group as the new accessed block group when the defective block is present, whereby the degree of integration can be improved by utilizing the sense amplifiers in common with no specific arrangement on the plurality of cell blocks.

The defect repair method for the semiconductor memory device according to the fifteenth aspect of the present invention can accurately perform defect repair for the semiconductor memory device according to the fifth aspect by repairing the defective block after determination of non-defectiveness of at least one spare cell array block.

The defect repair method for the semiconductor memory device according to the sixteenth aspect of the present invention can perform high-precision defect repair for the semiconductor memory device according to the fifth aspect also with evaluation of the data retention ability of at least one spare cell array block by performing the second test of determining non-defectiveness when each spare memory cell of at least one spare cell array block has data retention ability refreshable at the second refresh interval as the defectiveness/non-defectiveness test at the step (b).

The defect repair method for the semiconductor memory device according to the seventeenth aspect of the present invention can perform defect repair for the semiconductor memory device according to the twelfth aspect by repairing the defective block after the determination on non-defectiveness of the first and second spare cell array blocks.

The defect repair method for the semiconductor memory device according to the eighteenth aspect of the present invention performs the defectiveness/non-defectiveness test at the step (b) on only the spare cell array block sharing no sense amplifier with the defective block among the first and second spare cell array blocks, whereby the defectiveness/non-defectiveness test can be efficiently performed.

An object of the present invention is to obtain a semiconductor memory device which can effectively repair a defect without reducing the yield even if a spare memory cell has inferior data retention ability, and a defect repair method for a semiconductor memory device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Premise

As hereinabove described, a dynamic semiconductor memory device having a plurality of dynamic memory cells generally includes redundant memory cells for repairing any defective bit, in order to improve the yield. If it is possible to recognize whether or not the redundant memory cells are defective before defect repair, the defect repair can be prevented from a failure resulting from unrepairability caused by a defective spare row or column, thereby improving the success rate for the defect repair. If such spare memory cells are inferior in data retention ability not to reach a required reference value, however, the semiconductor memory device fails in repairing the defective bit, leading to reduction of the yield.

In general, a dynamic semiconductor memory device makes refresh operations cyclically along the overall chip in a certain constant period by a constant number of times of refresh operations. In case of a standard 256 Mb-DRAM, for example, a refresh cycle of 8 kc (=128 ms) is standard and it is necessary to successively select 8192 ($2^{13}$) word lines in 128 ms thereby refreshing selected memory cells. If the number of the word lines selected in one cycle (128 ms) is doubled ($2^{14}$) so that all word lines are selected in 4 kc (=64 ms), for example, the data retention ability (data holdability) required to each memory cell may be 64 ms. A memory cell having data retention ability of only 64 ms apparently has data retention ability of 128 ms, since each memory cell data is refreshed twice by word line selection of 8 kc. When such an operation is performed as to the entire memory cell array, however, operating blocks are doubled in each cycle to disadvantageously increase current consumption in practice.

Structure and Operation

Figure 1:
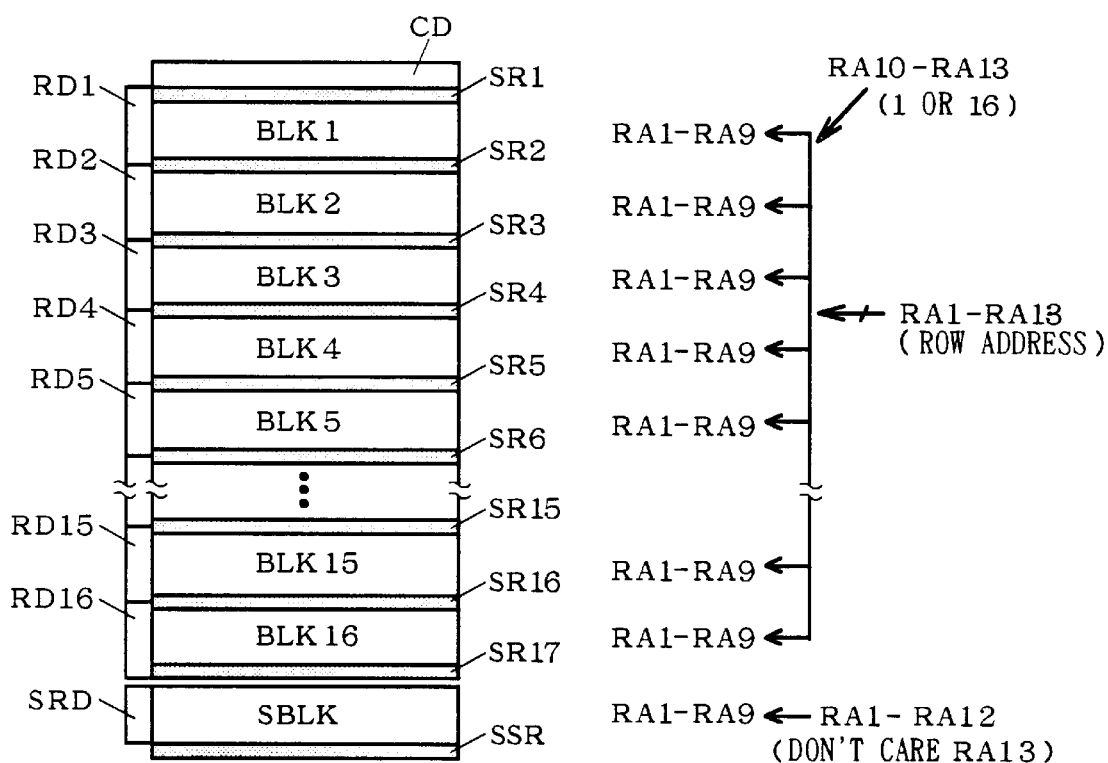
FIG. 1 is an explanatory diagram showing the concept of a dynamic semiconductor memory device according to an embodiment 1 of the present invention.

FIG. 1 is an explanatory diagram showing the concept of a dynamic semiconductor memory device according to an embodiment 1 of the present invention. As shown in FIG. 1, a memory cell array 1 is divided into normal cell array blocks BLK1 to BLK16. Sense amplifier zones SRi and SR(i+1) are provided on both sides (vertical direction in FIG. 1) of each normal cell array block BLKi (i=1 to 16), and each sense amplifier zone SRj (j=2 to 16) is shared by normal cell array blocks BLK(j-1) and BLKj.

The memory cell array 1 is further provided with a spare cell array block SBLK which is identical or similar to each normal cell array blocks BLKi. This spare cell array block SBLK employs a sense amplifier (not shown) formed in a sense amplifier zone SSR.

A column decoder CD is provided for the memory cell array 1, row decoders RD1 to RD16 are provided for the normal cell array blocks BLK1 to BLK16 respectively, and a spare row decoder SRD is provided for the spare cell array block SBLK. Further, memory cells (not shown in FIG. 1) are arranged in the form of a matrix in each normal cell array block BLK1 (i=1 to 16) and the spare cell array block SBLK, along with word lines for selecting rows of the memory cells and bit lines for reading/writing data from/in the memory cells.

When a memory cell provided in any block BLKp (p=any of 1 to 16) includes a defect in the aforementioned structure, the normal cell array block BLKp including the defect is electrically replaced with the spare cell array block SBLK by an existing method such as the laser fuse program system, for repairing the defect. After the defect repair, the semiconductor memory device operates to access the spare cell array block SBLK if the normal cell array block BLKp is selected.

After the defect repair, the normal cell array blocks BLK1 to BLK16 which are normal blocks are refreshed in 8 kc respectively, while the spare cell array block SBLK is refreshed in 4 kc. The detail thereof is now described.

Rows of the normal cell array blocks BLK1 to BLK16 are selected by 13-bit row addresses RA1 to RA13 corresponding to a refresh period of 8 kc respectively, so that the selected rows are successively refreshed. The semiconductor memory device is so structured as to select the spare memory array block SBLK by 12-bit row addresses for 4 kc excluding the most significant row address RA13 in the 13-bit row addresses RA1 to RA13 of 8 kc.

Figure 2:
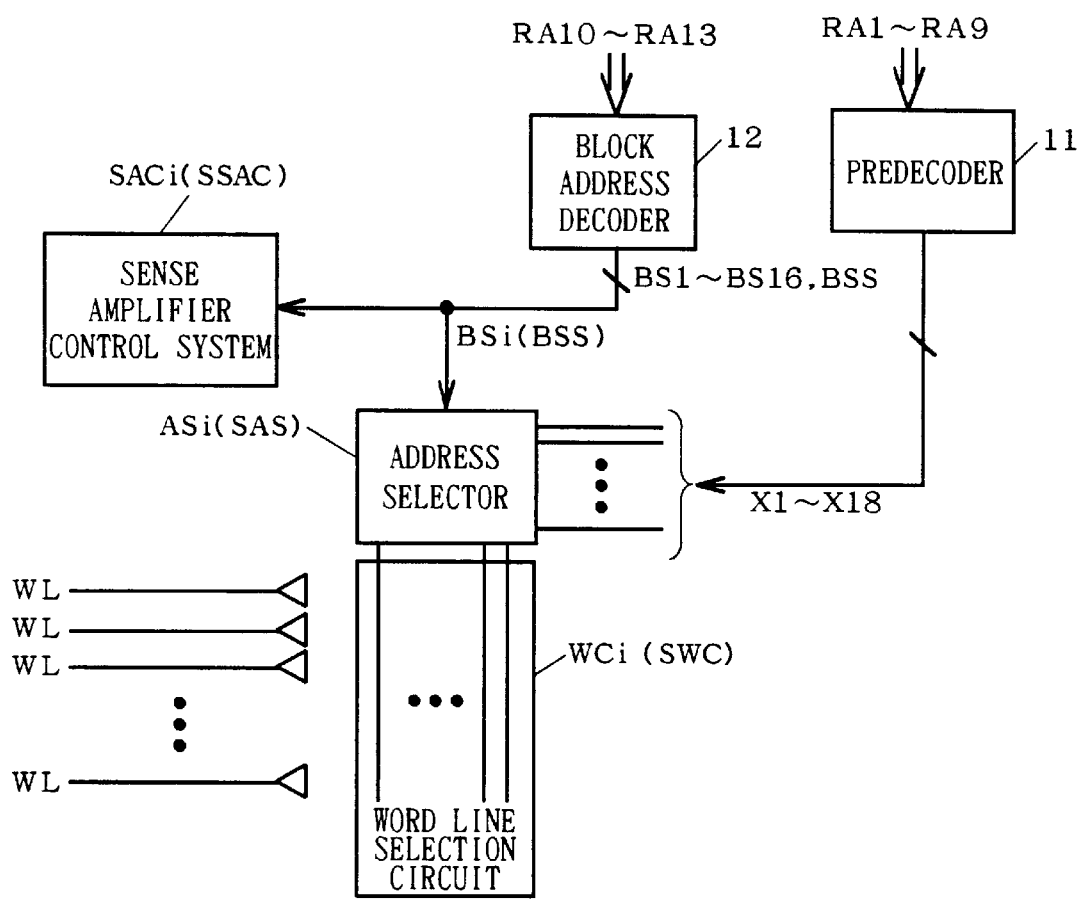
FIG. 2 is a block diagram showing a row address control system according to the embodiment 1.

FIG. 2 is a block diagram showing the structure of a row address control system of the dynamic semiconductor memory device according to the embodiment 1. As shown in FIG. 2, a block address decoder 12 selectively activates block selection signals BS1 to BS16 and BSS on the basis of the row addresses RA10 to RA13.

Figure 3:
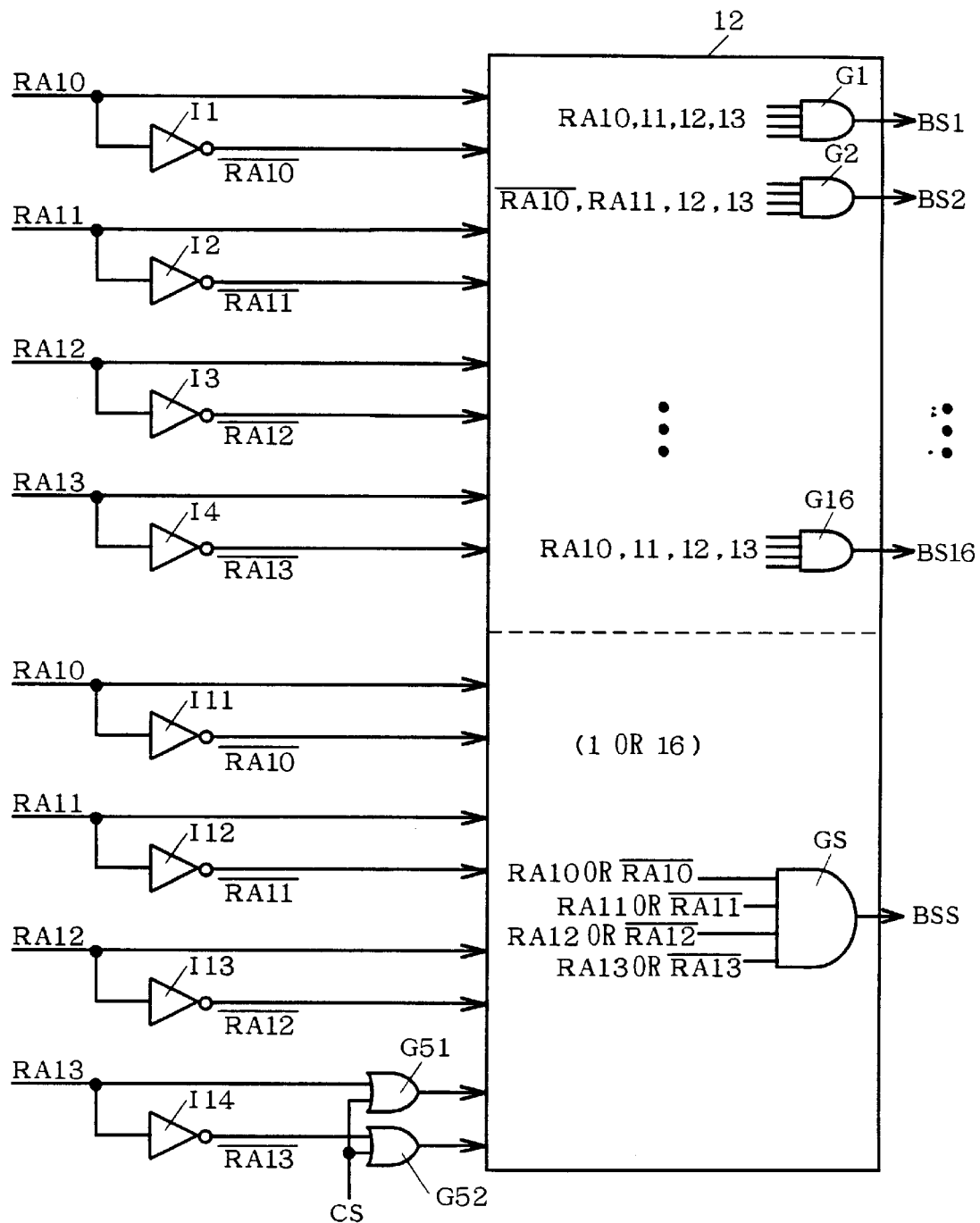
FIG. 3 is a circuit diagram showing the internal structure of a block address decoder shown in FIG. 2.

FIG. 3 is an explanatory diagram showing the internal structure of the block address decoder 12. As shown in FIG. 3, the block address decoder 12 receives row address signals RA10 to RA13 and inverted row address signals /RA10 to /RA13 obtained by inverting the signals RA10 to RA13 in invertors I1 to I4 respectively for the block selection signals BS1 to BS16.

Further, the block address decoder 12 independently receives inverted the row address signals RA10 to RA13 and inverted row address signals /RA10 to /RA13 obtained by inverting the signals RA10 to RA13 in invertors I11 to I14 respectively for the spare block selection signal BSS. Both the row address signal RA13 and the inverted row address signal /RA13 are fixed at high levels by OR gates G51 and G52 receiving a high-level control signal CS in first inputs thereof respectively.

AND gates G1 to G16 output the block selection signals BS1 to BS16 of active states when addressed four signals RA10 (/RA10) to RA13 (/RA13) go high respectively.

An AND gate GS outputs the block selection signal BSS of an active state when the four signals RA10 (/RA10) to RA13 (/RA13) addressed in place of the defective block BLKp go high. However, both the signals RA13 and /RA13 are fixed at high levels, and hence the AND gate GS outputs the active block selection signal BSS when the remaining three signals RA10 (/RA10) to RA12 (/RA12) go high in practice.

Referring again to FIG. 2, a predecoder 11 decodes the row address signals RA1 to RA9, selectively activates selection signals X1 to X18, and outputs the same to each address selector ASi (i=1 to 16) and a spare address selector SAS.

As hereinabove described, the block address decoder 12 decodes the row address signals RA10 to RA13, selectively activates the block selection signals BS1 to BS16 and BSS, and outputs the same to each address selector ASi (SAS) and each sense amplifier control system SACi (spare sense amplifier control system SSAC).

The address selector ASi (SAS) receiving any active block selection signal BSi (BSS) is activated to output a word line selection signal to a word line selection circuit WCi (spare word line selection circuit SWC) on the basis of any of the selection signals X1 to X18.

The word line selection circuit WCi (SWC) selectively activates a word line WL of a corresponding block on the basis of the word line selection signal received from the corresponding address selector ASi (SAS), for selecting a row of the memory cell array. Each row decoder RD shown in FIG. 1 corresponds to the word line selection circuit WCi.

In the dynamic semiconductor memory device according to the embodiment 1 having the aforementioned structure, the spare cell array block SBLK specifically addressed by the row addresses RA10 to RA12 in the refresh period of 8 kc is accessed twice when RA13="1" and RA13="0", and can be refreshed in a refresh period of 4 kc.

In a general memory access operation, however, memory cell selection addresses are in accordance with row addresses of 8 kc including the row address RA13. Namely, it means that memory cell data are correctly accessed in accordance with externally applied row addresses under control by a data input/output system (not shown), while any of the cell array blocks BLK1 to BLK16 and the spare cell array block SBLK may be simultaneously selected and word line selection/refresh operations may be excessively performed in the interior.

Effect

As hereinabove described, the dynamic semiconductor memory device according to the embodiment 1 makes it possible to refresh the spare cell array block SBLK at a short refresh interval even if the substitutional spare cell array block SBLK has inferior data retention ability, thereby enabling a sufficiently normal refresh operation. Consequently, the success rate for defect repair is increased and the yield is improved.

Further, data retention ability required to the spare cell array block SBLK is relatively low and hence no refresh test is necessary for the spare cell array block SBLK, whereby the time for a refresh test can be reduced. Further, the capacity of a fail memory storing test result information in a test system (test circuit) can also be reduced.

Embodiment 2

Structure and Operation

Figure 4:
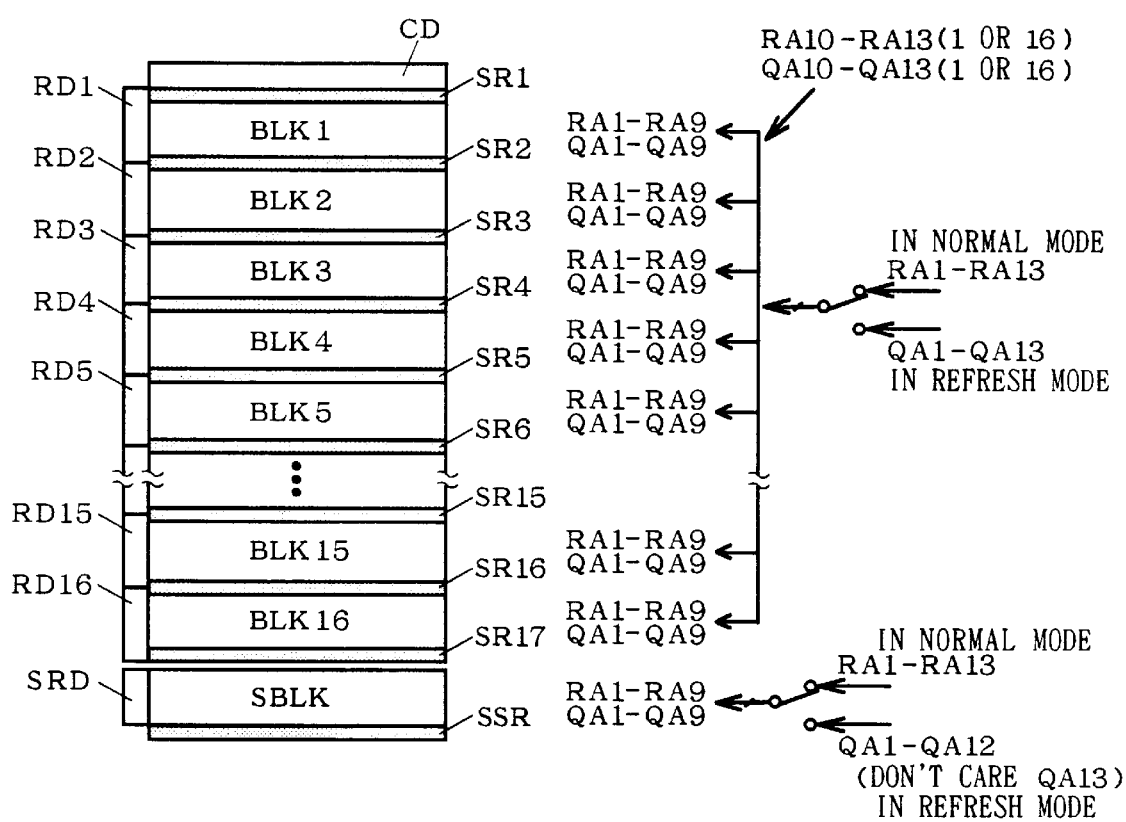
FIG. 4 is an explanatory diagram showing the concept of a dynamic semiconductor memory device according to an embodiment 2 of the present invention.

FIG. 4 is an explanatory diagram showing the concept of a dynamic semiconductor memory device according to an embodiment 2 of the present invention. Parts similar to those in FIG. 1 are denoted by the same reference numerals, to properly omit redundant description.

As shown in FIG. 4, the dynamic semiconductor memory device according to the embodiment 2 makes different access operations in a normal mode and a refresh mode. The refresh mode includes CBR ($\overline{CAS}$ before $\overline{RAS}$) refresh operations, self refresh operations and the like, and makes word line select/refresh operation of a corresponding row address in accordance with a refresh address generated by an internal address counter.

After defect repair to a spare cell array block SBLK, the semiconductor memory device according to the structure of the embodiment 2 operates as follows:

In the normal mode, rows of normal cell array blocks BLK1 to BLK16 are selected by 13-bit row addresses RA1 to RA13 respectively for general operations (read and write operations etc.) of selected rows, while a row of the spare cell array block SBLK is selected by the 13-bit row addresses RA1 to RA13, for a general operation of the selected row.

In the refresh mode, on the other hand, the normal cell array blocks BLK1 to BLK16 are refreshed by 13-bit refresh row addresses QA1 to QA13 of 8 kc respectively, while the spare cell array block SBLK is refreshed by 12-bit refresh row addresses QA1 to QA12 of 4 kc.

Figure 5:
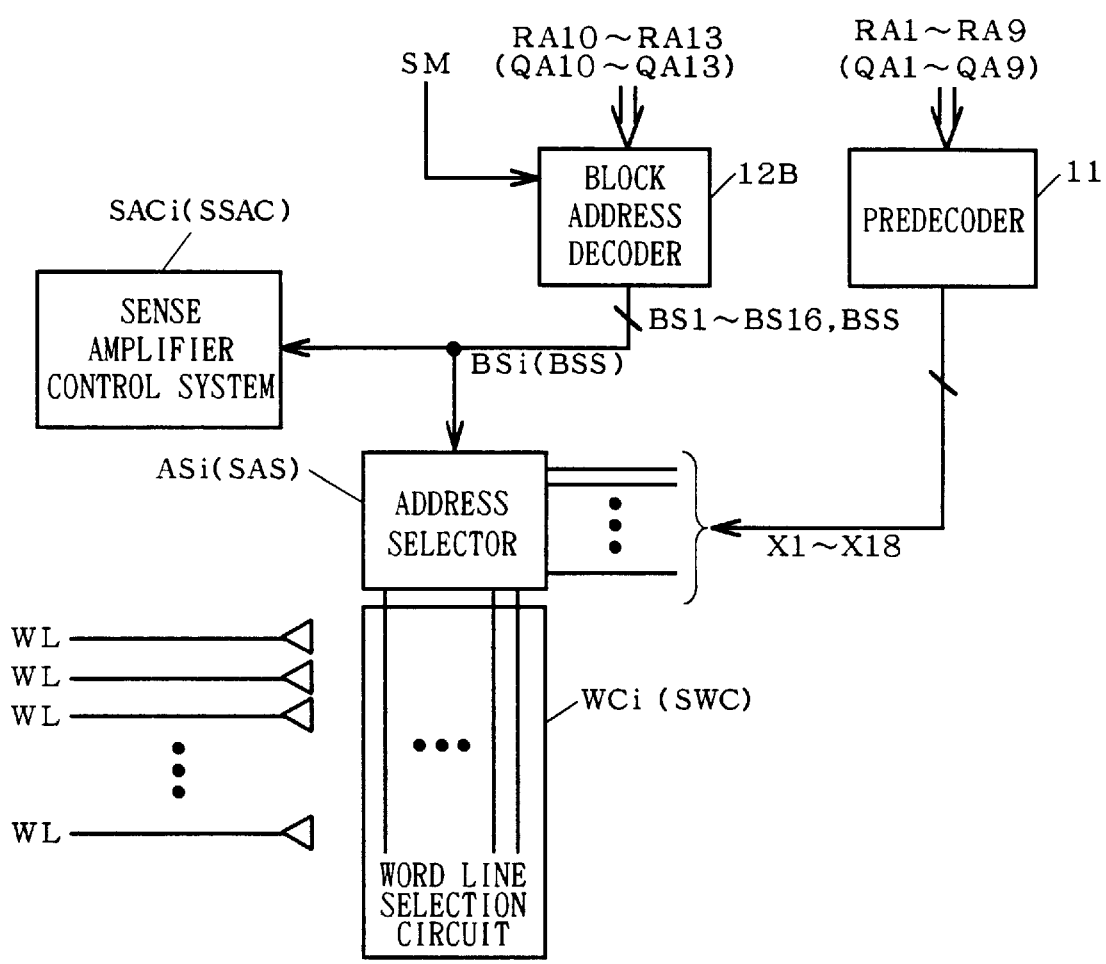
FIG. 5 is a block diagram showing a row address control system according to the embodiment 2.

FIG. 5 is a block diagram showing the structure of a row address control system of the dynamic semiconductor memory device according to the embodiment 2. Parts similar to those in FIG. 2 are denoted by the same reference numerals, to properly omit redundant description.

As shown in FIG. 5, a block address decoder 12B according to the embodiment 2 selectively activates block selection signals BS1 to BS16 and BSS on the basis of the row addresses RA10 to RA13 (QA10 to QA13). At this time, the block address decoder 12B receives a mode signal SM indicating the normal or refresh mode, for validating the maximum bit address (RA13) for the spare block selection signal BSS when the mode signal SM indicates the normal mode while invalidating the maximum bit address (QA13) when the mode signal SM indicates the refresh mode.

In more concrete terms, the block address decoder 12B may perform internal control to bring a control signal CS to a low level in the normal mode while bringing the control signal CS to a high level in the refresh mode in the structure shown in FIG. 3. Referring to FIG. 3, it is assumed that the parts indicated by the row addresses RA10 to RA13 are replaced with the refresh row addresses QA10 to QA13 in the refresh mode.

In the dynamic semiconductor memory according to the embodiment 2 having the aforementioned structure, the spare cell array block SBLK specifically addressed by the refresh row addresses QA10 to QA13 is accessed twice when QA13="1" and QA13="0" regardless of the value of the refresh row address QA13 in a refresh period of 8 kc in the refresh mode, and can be refreshed in a refresh period of 4 kc.

In the normal mode, on the other hand, the spare cell array block SBLK is accessed by the values of the row addresses RA1 to RA13, similarly to the normal cell array blocks BLK1 to BLK16.

Effect

In addition to the effect of the embodiment 1, the embodiment 2 attains the following effect:

Power consumption in excessive word line selection in the spare cell array block SBLK can be increased only in the refresh mode, whereby a problem such as increase of the access time resulting from unstableness of a power system caused by increase of current consumption can be avoided in the normal mode.

Embodiment 3

Premise

While the spare cell array block SBLK is refreshed in the refresh cycle of 4 kc in each of the embodiments 1 and 2, the present invention is not restricted to this cycle but the spare cell array block SBLK may alternatively be refreshed in a shorter cycle of 2 kc or 1 kc. The refresh cycle is preferably varied with the data retention ability of the spare cell array block SBLK.

Structure and Operation

Figure 6:
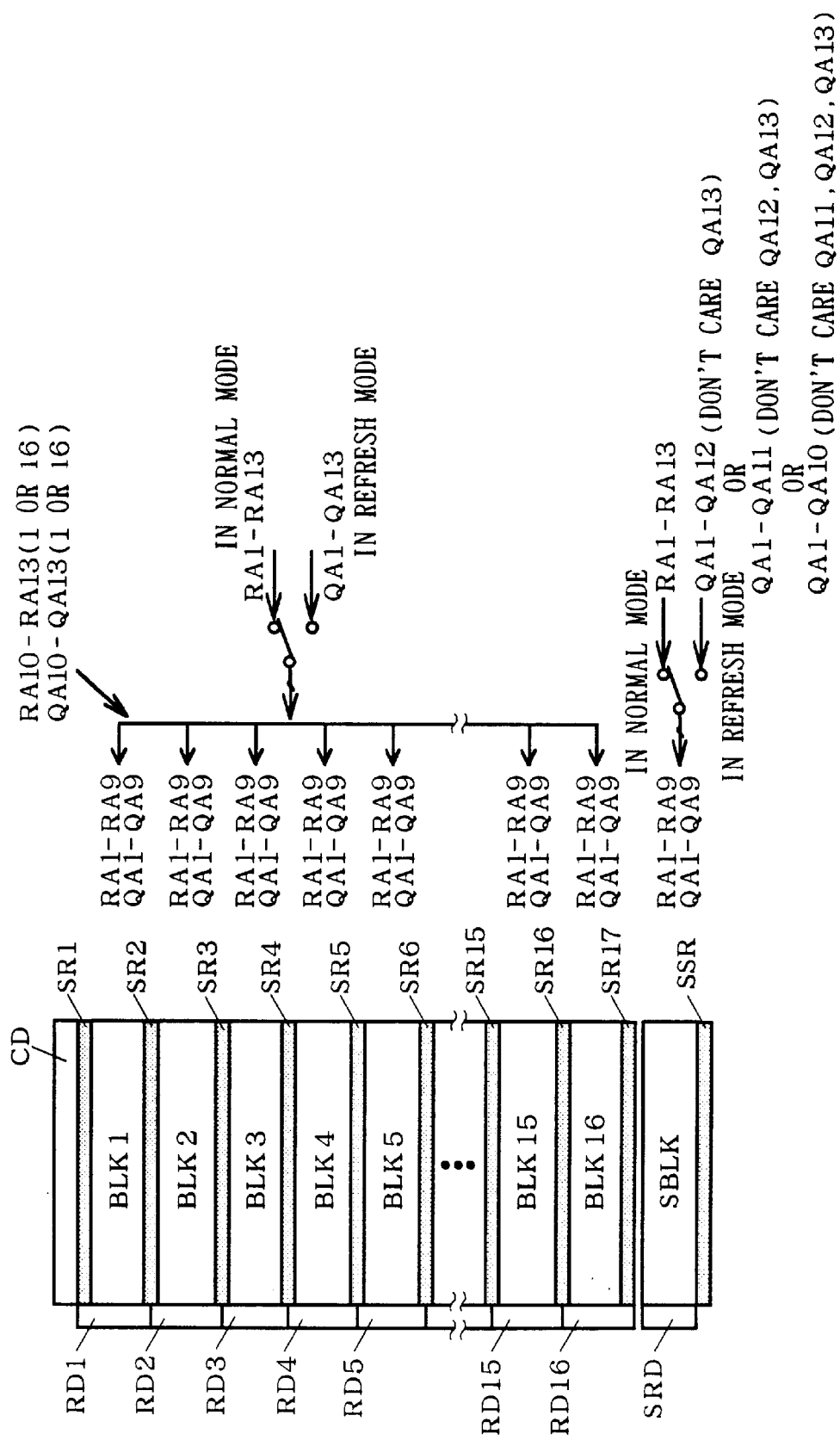
FIG. 6 is an explanatory diagram showing the concept of a dynamic semiconductor memory device according to an embodiment 3 of the present invention.

FIG. 6 is an explanatory diagram showing the concept of a dynamic semiconductor memory device according to an embodiment 3 of the present invention. Parts similar to those in FIG. 1 or 2 are denoted by the same reference numerals, to properly omit redundant description.

After defect repair to a spare cell block SBLK, the semiconductor memory device of the structure according to the embodiment 3 operates as follows:

In a normal mode, rows of normal cell array blocks BLK1 to BLK16 are selected by 13-bit row addresses RA1 to RA13 respectively for general operations (read and write operations etc.) of the selected rows, while a row of a spare cell array block SBLK is selected by the 13-bit row addresses RA1 to RA13 for general operations of the selected row.

In a refresh mode, on the other hand, the normal cell array blocks BLK1 to BLK16 are refreshed by 13-bit refresh row addresses QA1 to QA13 of 8 kc respectively, while the spare cell array block SBLK is refreshed by 12-bit refresh row addresses QA1 to QA12 of 4 kc, 11-bit refresh row addresses QA1 to QA11 of 2 kc, or 10-bit refresh row addresses QA1 to QA10 of 1 kc.

Figure 7:
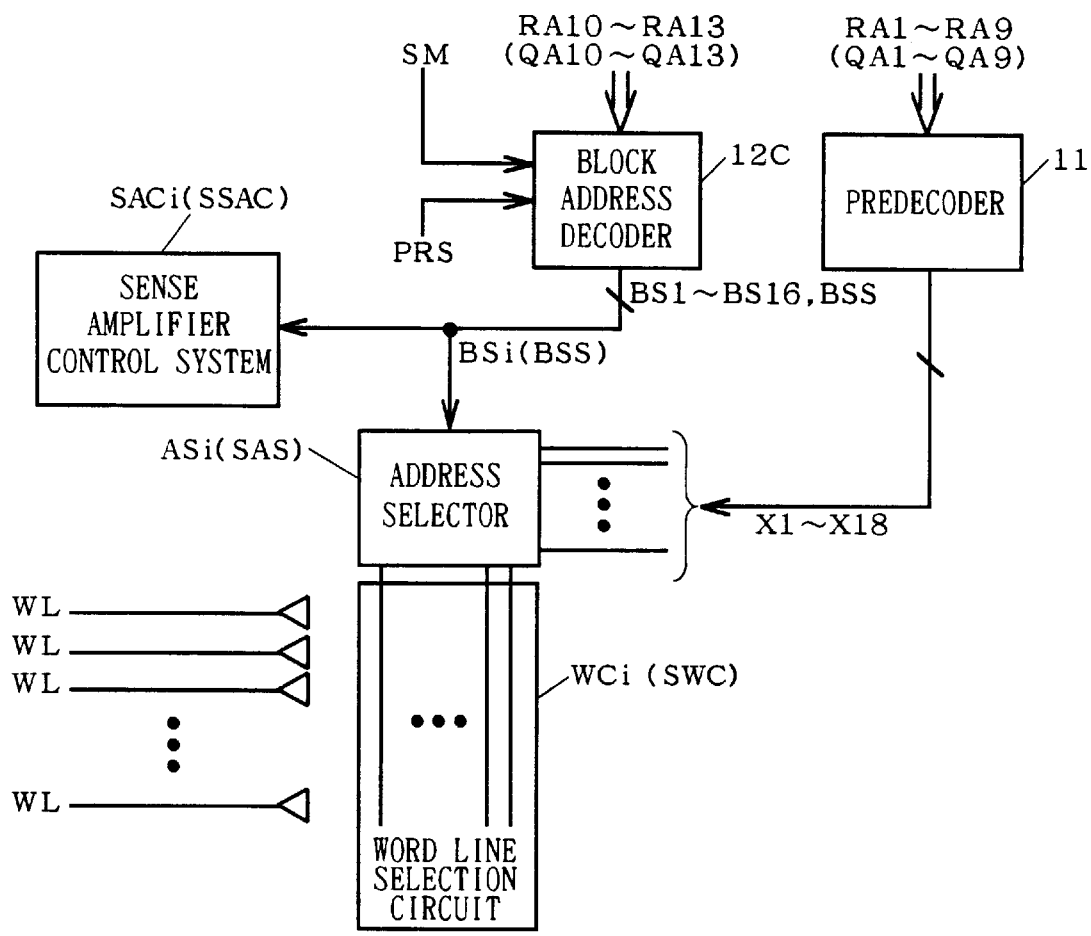
FIG. 7 is a block diagram showing a row address control system according to the embodiment 2.

FIG. 7 is a block diagram showing the structure of a row address control system of the dynamic semiconductor memory device according to the embodiment 3. Parts similar to those in FIG. 2 are denoted by the same reference numerals, to properly omit redundant description.

As shown in FIG. 7, a block address decoder 12C of the dynamic semiconductor memory device according to the embodiment 3 further receives a refresh cycle program signal PRS, and decides a refresh cycle for the spare cell array block SBLK on the basis of this signal.

Figure 8:
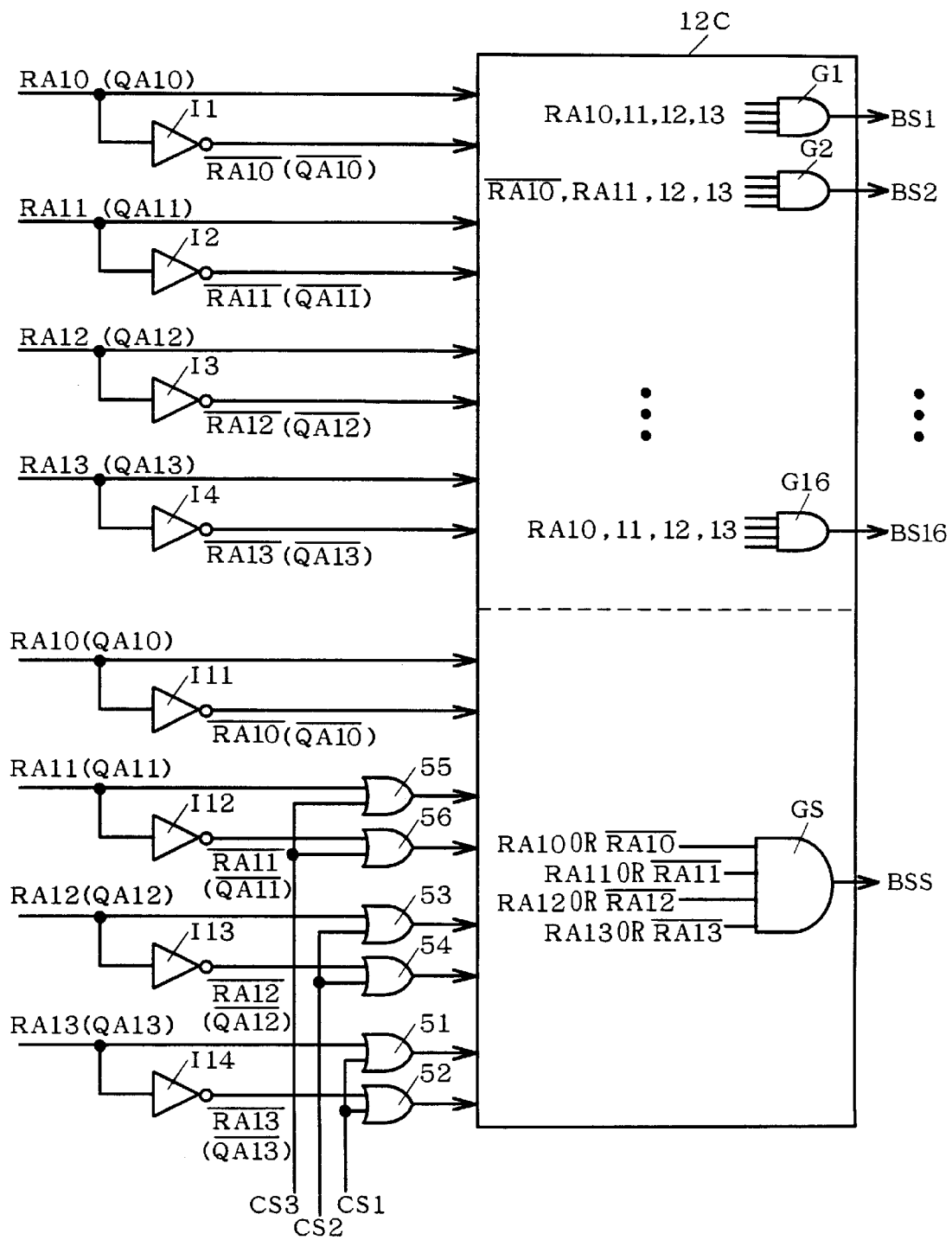
FIG. 8 is a circuit diagram showing the internal structure of a block address decoder shown in FIG. 5.

FIG. 8 is an explanatory diagram showing the structure of the block address decoder 12C according to the embodiment 3. Parts similar to those in FIG. 3 are denoted by the same reference numerals, to properly omit redundant description. Referring to FIG. 8, row address signals RA10 to RA13 include refresh row address signals QA10 to QA13.

As shown in FIG. 8, the row address signal RA13 and an inverted row address signal /RA13 are fixed at high levels by OR gates G51 and G52 receiving a control signal CS1, or passed through. The row address signal RA12 and an inverted row address signal /RA12 are fixed at high levels by OR gates G53 and G54 receiving a control signal CS2, or passed through. The row address signal RA11 and an inverted row address signal /RA11 are fixed at high levels by OR gates G55 and G56 receiving a control signal CS3, or passed through.

In more concrete terms, internal control is so made as to bring the control signals CS1 to CS3 to low levels in a normal mode, to high, low and low levels respectively in 2 kc in a refresh mode, to high, high and low levels respectively in 2 kc, and to high levels in 1 kc. The contents of the control signals CS1 to CS3 are decided by a mode signal SM and the refresh cycle program signal PRS.

The dynamic semiconductor memory device according to the embodiment 3 having the aforementioned structure can refresh the spare cell array block SBLK which is specifically addressed by the refresh row addresses QA10 to QA13 in a refresh period of 4, 2 or 1 kc on the basis of the refresh cycle program signal PRS, in a refresh period of 8 kc in the refresh mode.

Effect

In addition to the effects of the embodiments 1 and 2, the embodiment 3 attains the following effect:

The yield can be further improved by setting a refresh cycle most suitable to the data retention ability of the spare cell array block SBLK.

Embodiment 4

Premise

While each of the embodiments 1 to 3 comprises the spare block for defect repair of the memory array for replacing the defective block in the block unit, the embodiments 1 to 3 are inferior in repair efficiency due to the replacement in the block unit.

Structure and Operation

Figure 9:
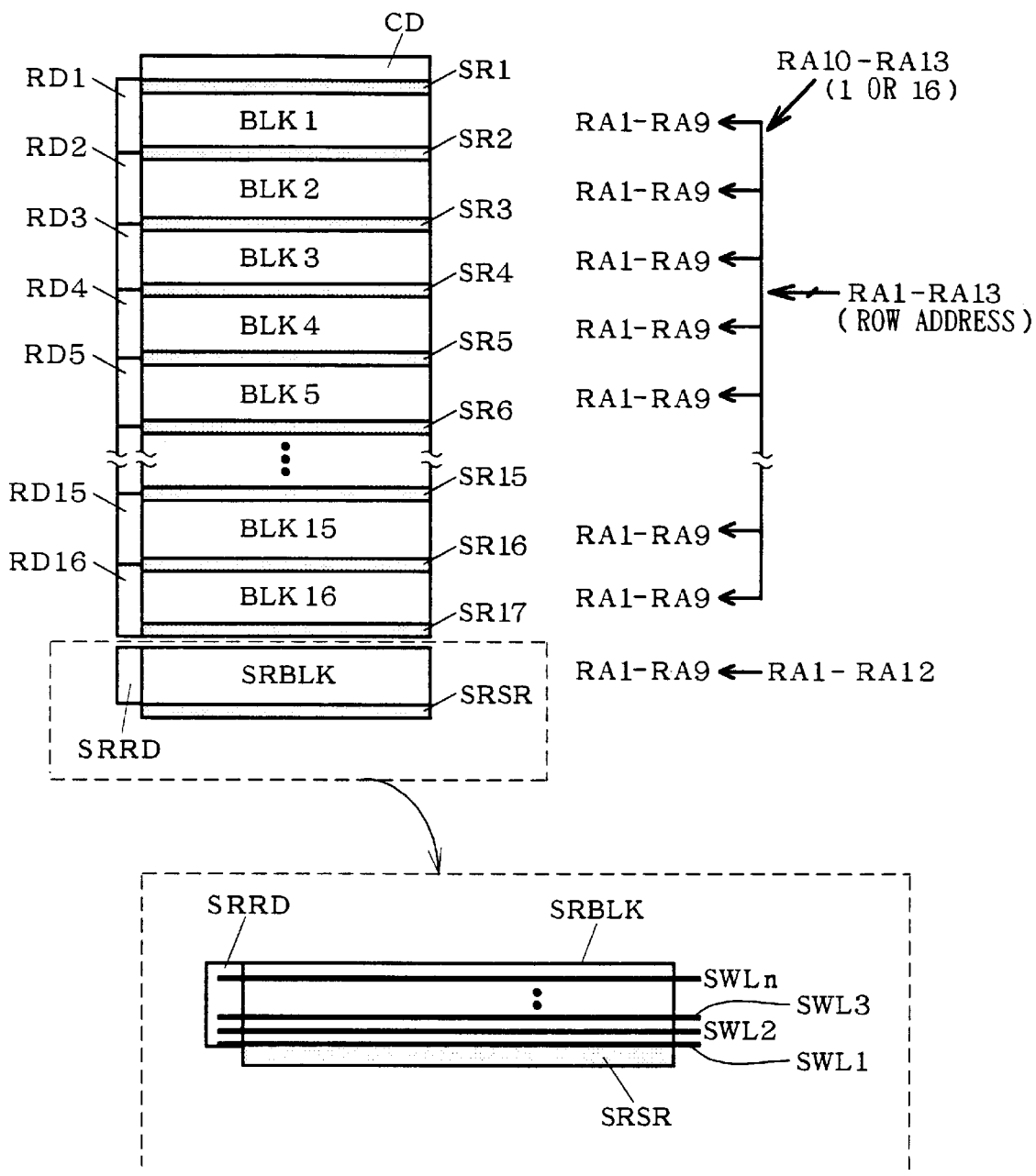
FIG. 9 is an explanatory diagram showing the concept of a dynamic semiconductor memory device according to an embodiment 4 of the present invention.

FIG. 9 is an explanatory diagram showing the concept of a dynamic semiconductor memory device according to an embodiment 4 of the present invention. Parts similar to those in FIG. 1 are denoted by the same reference numerals, to properly omit redundant description.

When a memory cell of any block BLKp (p=any of 1 to 16) includes a defect, the dynamic semiconductor memory device according to the embodiment 4 electrically replaces a word line (not shown) of the normal cell array block BLKp including the defect with any of spare word lines SWL1 to SWLn in a spare cell array block SRBLK by an existing method such as the laser fuse program system for repairing the defect. After the defect repair, the semiconductor memory device so operates as to access the substitutional row in the spare cell array block SRBLK when a row of the normal cell array block BLKp is selected. Referring to FIG. 9, symbol SRRD denotes a row decoder provided for the spare cell array block SRBLK, and symbol SRSR denotes a sense amplifier zone for the spare cell array block SRBLK.

Figure 10:
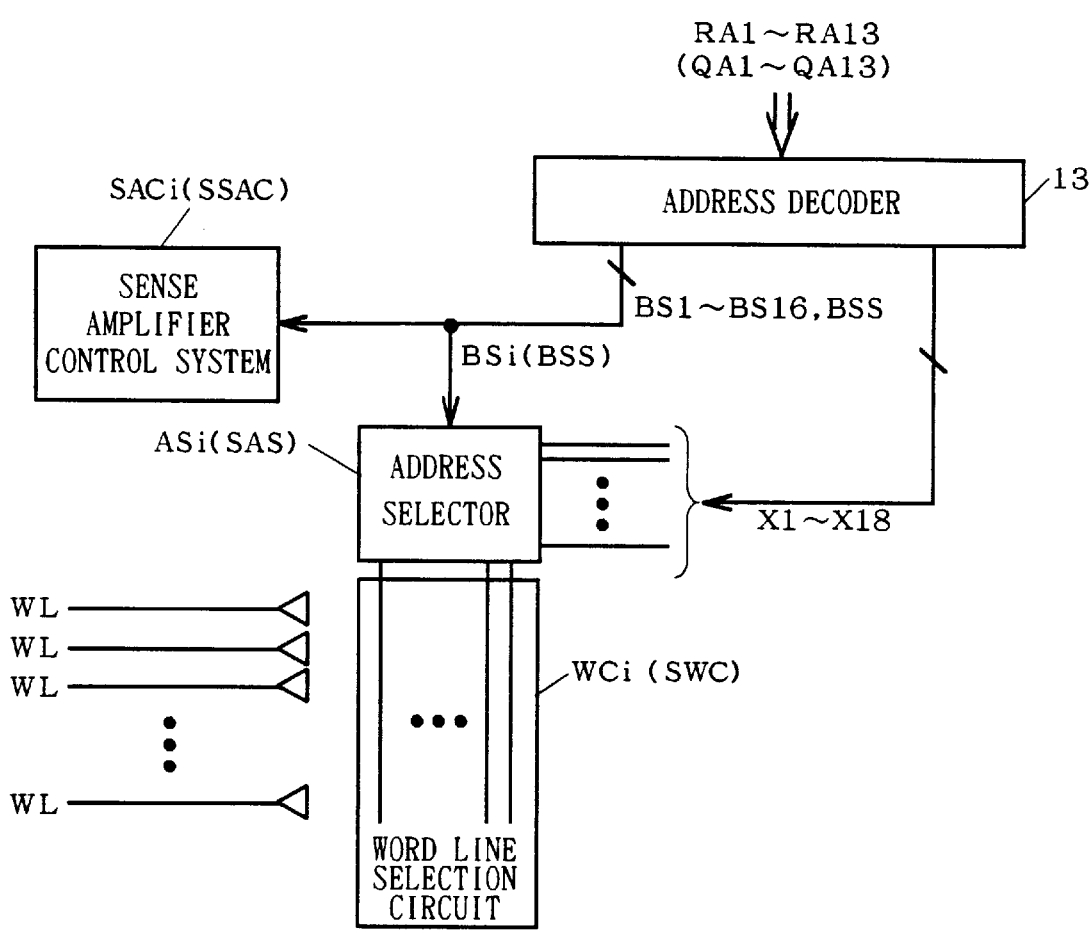
FIG. 10 is a block diagram showing a row address control system according to the embodiment 4.

FIG. 10 is a block diagram showing the structure of a row address control system of the dynamic semiconductor memory device according to the embodiment 4. Parts similar to those in FIG. 2 are denoted by the same reference numerals, to properly omit redundant description.

As shown in FIG. 10, an address decoder 13 selectively activates block selection signals BS1 to BS16 and BSS on the basis of row addresses RA1 to RA13, while selectively activating selection signals X1 to X18.

The address decoder 13 basically has the functions of the predecoder 11 and the block address decoder 12 according to the embodiment 1, as well as a function of determining activity/inactivity of a spare block selection signal BSS and activity/inactivity of a normal cell array block BLKi having a replaced row on the basis of the row addresses RA1 to RA13.

In the dynamic semiconductor memory device according to the embodiment 4 having the aforementioned structure, it comes to that the spare cell array block SRBLK specifically addressed by refresh row addresses QA10 to QA13 are accessed twice when QA13="1" and QA13="0" regardless of the value of the refresh row address QA13 in a refresh period of 8 kc in a refresh mode, and can be refreshed in a refresh period of 4 kc.

Figure 11:
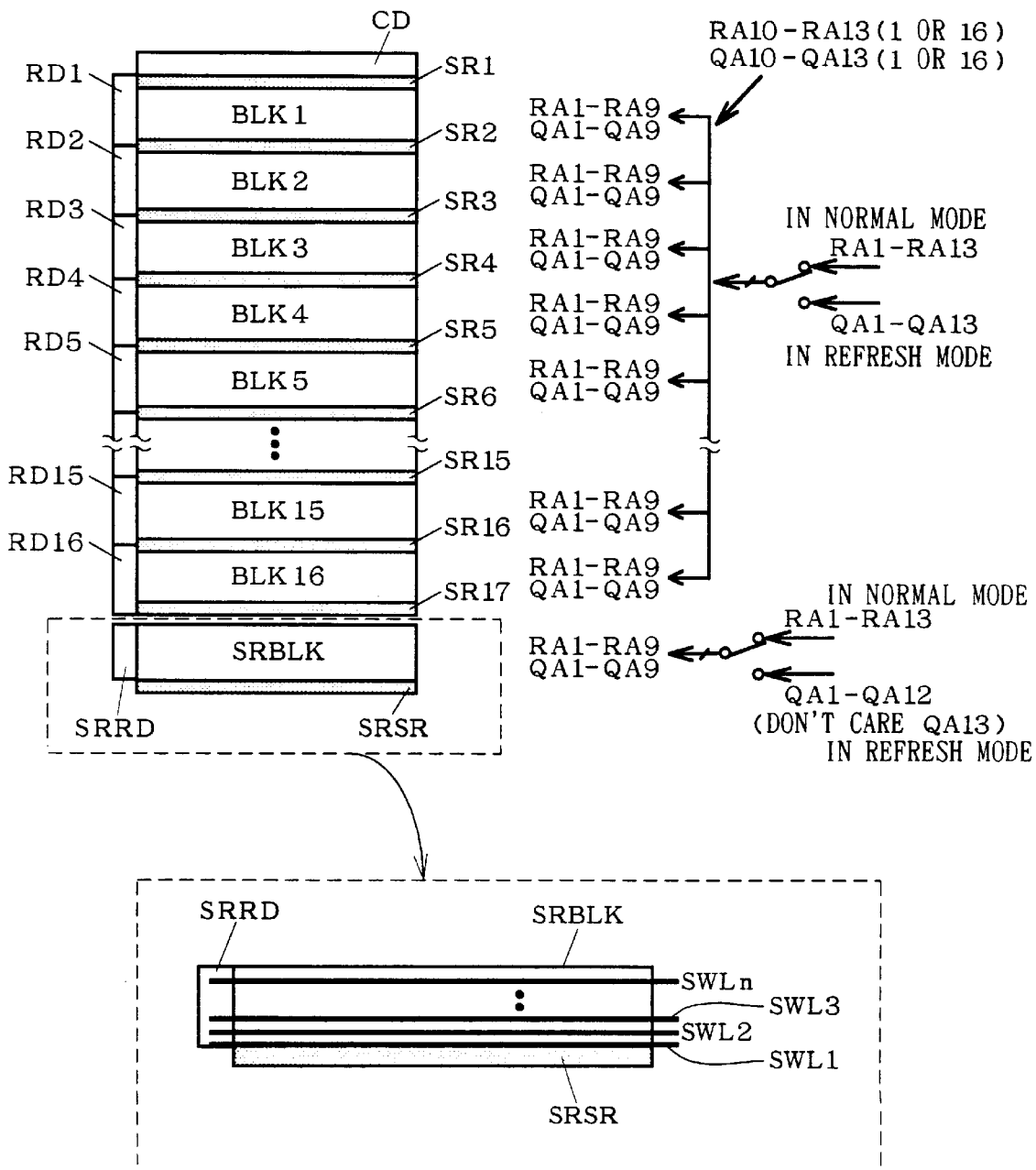
FIG. 11 is an explanatory diagram showing the concept of another structure according to the embodiment 4.

While the structure of the embodiment 4 corresponds to that of the embodiment 1, this embodiment may alternatively access the spare cell array block SRBLK in a different manner in normal and refresh modes as shown in FIG. 11 in correspondence to the embodiment 2, or may variably set a refresh cycle for the spare cell array block SRBLK in correspondence to the embodiment 3.

Effect

In addition to the effects of the embodiments 1 and 2, the embodiment 4 attains the following effect:

The semiconductor memory device can attain a similar repair effect in a replacement structure of a smaller unit than the structure of the spare cell array block SRBLK, thereby improving repair efficiency.

Embodiment 5

Premise

In a dynamic semiconductor memory device, an internal address counter and an internal refresh timer generally perform refresh operations in a self refresh mode. In this case, the semiconductor memory device programs, tunes and optimizes the period of the refresh timer in response to the data retention ability of the overall memory array. In this method, however, it is difficult to implement a circuit structure making wide-ranging tuning while uniformly maintaining temperature dependence and power supply voltage dependence.

In order to solve this problem, the refresh interval may be tuned while programming the period of the refresh timer in a constant or narrow range and rendering refresh cycles for all memory cells in a self refresh mode programmable.

Structure and Operation

Figure 12:
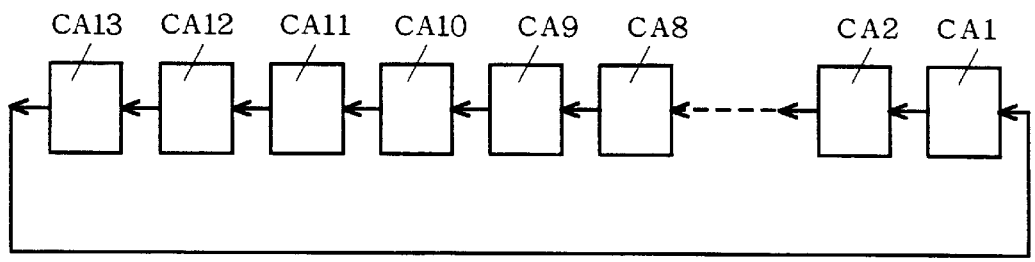
FIG. 12 is a block diagram showing an exemplary structure of a refresh address counter employed in a dynamic semiconductor memory device according to an embodiment 5 of the present invention.

FIG. 12 is a block diagram showing an exemplary structure of a refresh address counter employed in a dynamic semiconductor memory device according to an embodiment 5 of the present invention. As shown in FIG. 12, this embodiment is structured by loop-connecting 13 1-bit counters CA1 to CA13 operating in synchronization with a prescribed clock with each other. Outputs of the counters CA1 to CA13 become refresh addresses QA1 to QA13.

Figure 13:
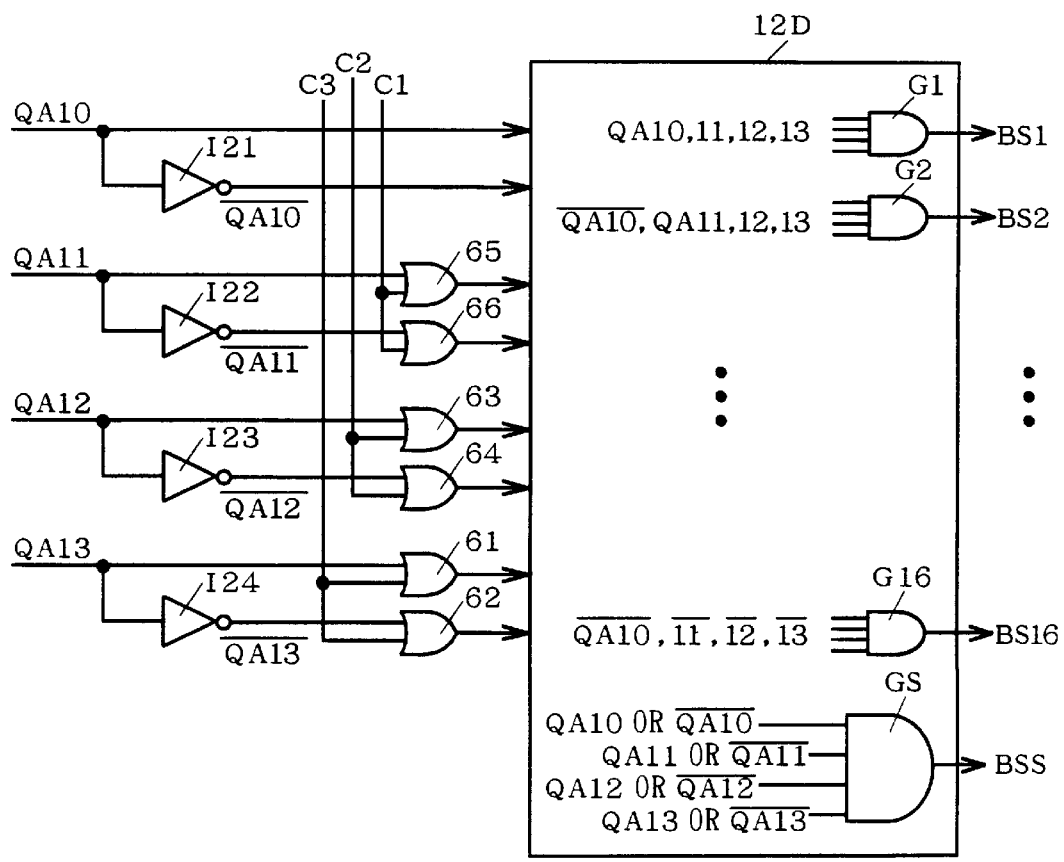
FIG. 13 is a circuit diagram showing the internal structure of a block address decoder according to the embodiment 5.

FIG. 13 is a circuit diagram showing the internal structure of a block address decoder 12D employed in the dynamic semiconductor memory device according to the embodiment 5. The peripheral structure of the block address decoder 12D is similar to the structure of the embodiment 1 shown in FIG. 1.

As shown in FIG. 13, the block address decoder 12D according to the embodiment 5 receives refresh address signals QA10 to QA13 (row addresses RA10 to RA13 in general operation) and inverted refresh address signals /QA10 to /QA13 obtained by inverting the refresh address signals QA10 to QA13 through invertors I21 to I24 respectively for block selection signals BS1 to BS16 and BSS. The refresh row address signal QA13 and the inverted row address signal /QA13 are fixed at high levels by OR gates G61 and G62 receiving an external control signal C1, or passed through. The refresh row address signal QA12 and the inverted row address signal /QA12 are fixed at high levels by OR gates G63 and G64 receiving an external control signal C2, or passed through. The refresh row address signal QA11 and the inverted row address signal /QA11 are fixed at high levels by OR gates G65 and G66 receiving an external control signal C3, or passed through.

In more concrete terms, the control signals C1 to C3 are brought to low levels in 8 kc, brought to high, low and low levels respectively in 4 kc, or set at high levels in 1 kc.

Effect

The semiconductor memory device can implement a self refresh operation optimized in response to data retention ability by programming an internal refresh interval of a general self refresh operation, thereby improving the yield.

Embodiment 6

Premise

In general, an internal counter and an internal timer perform self refresh operations, and hence the operating states thereof cannot be tested from the exterior. Thus, a check method is necessary.

Processing Content 1

Figure 14:
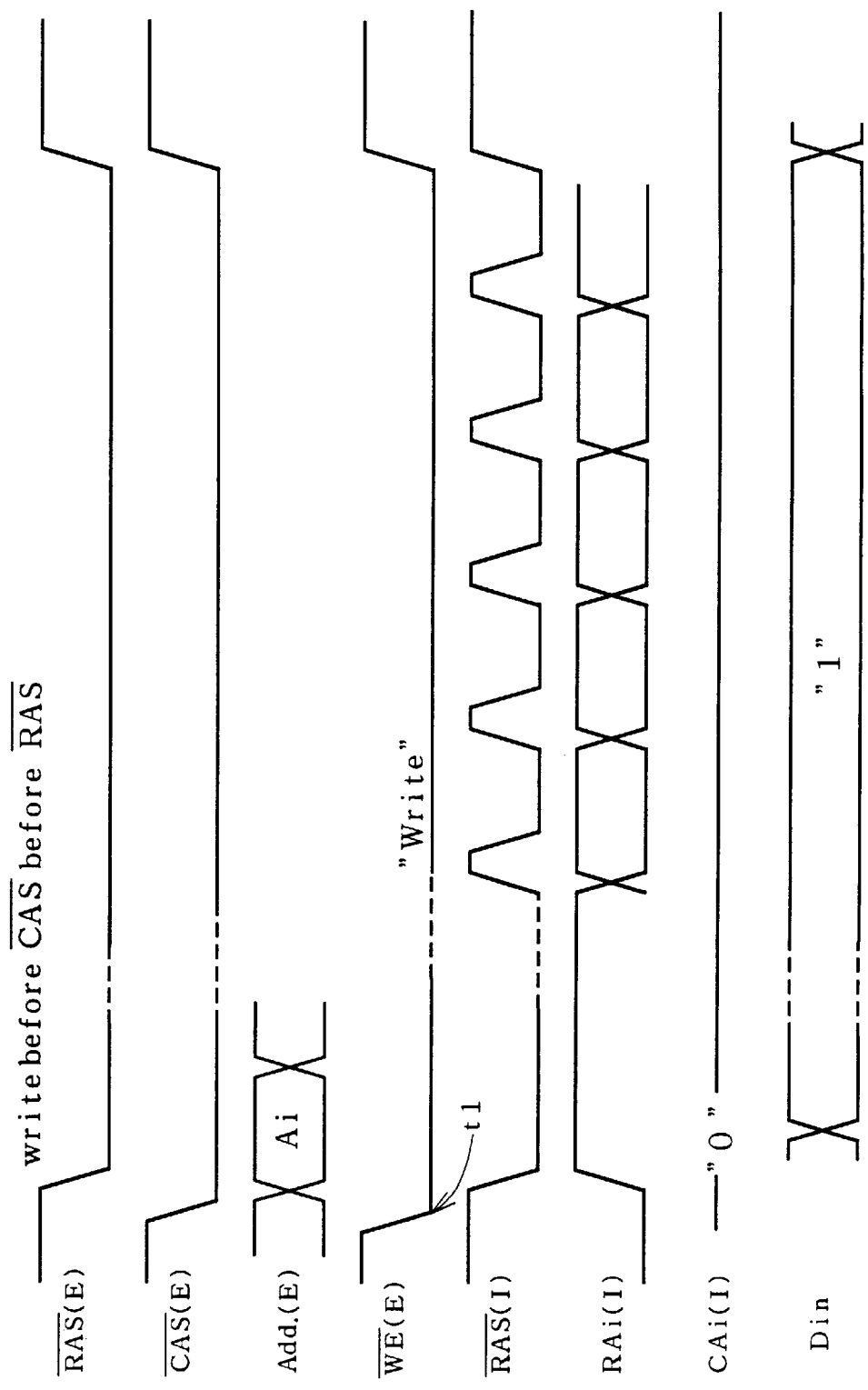
FIG. 14 is a timing chart for illustrating a method of checking an internal refresh cycle according to the embodiment 6.
Figure 15:
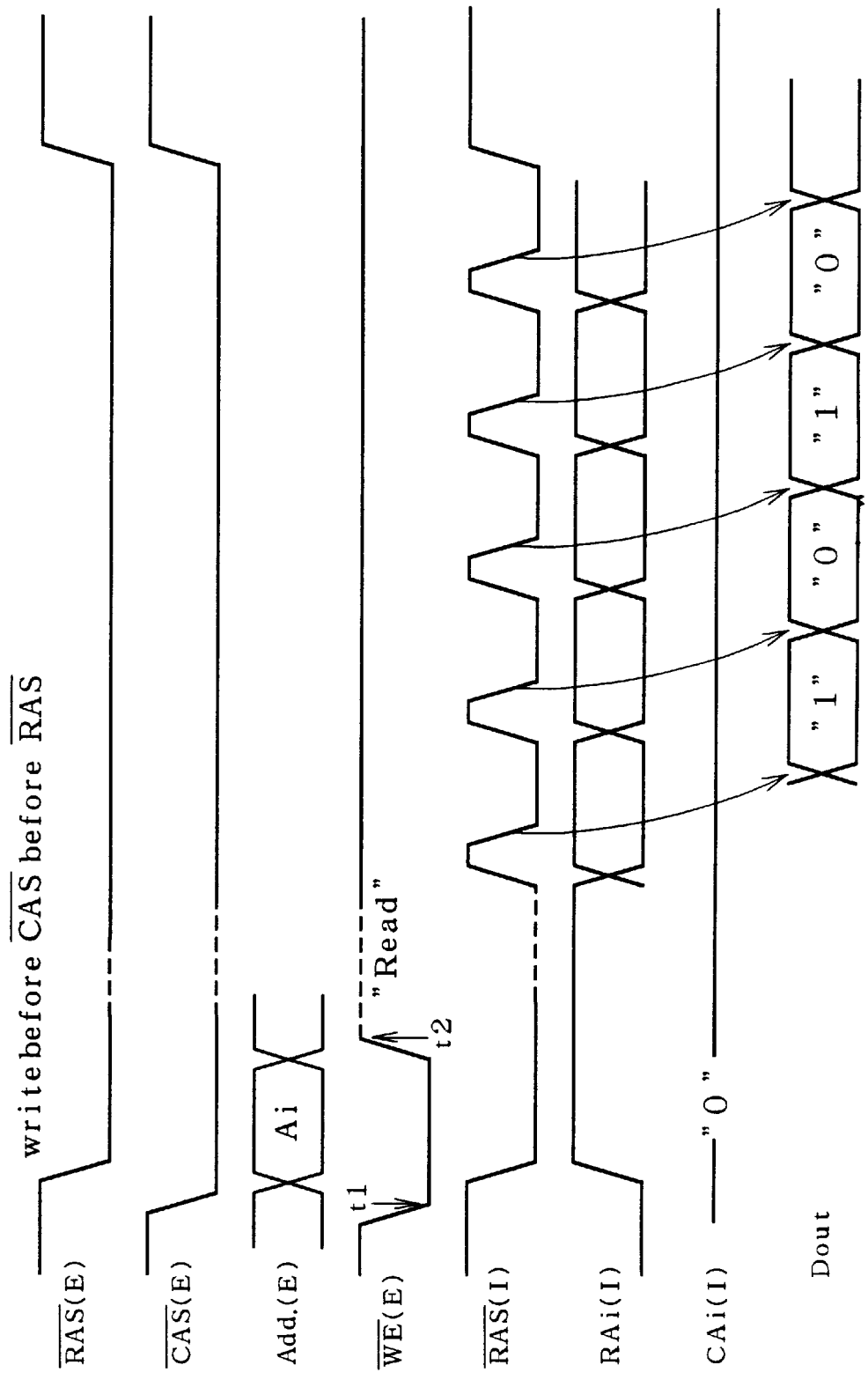
FIG. 15 is a timing chart for illustrating the method of checking an internal refresh cycle according to the embodiment 6.

An embodiment 6 of the present invention is directed to a method of checking a refresh cycle of an internal refresh operation. FIGS. 14 and 15 are timing charts for illustrating a first check method according to the embodiment 6. Referring to FIGS. 14 and 15, symbol /RAS(E) denotes an external row address strobe signal, symbol /CAS(E) denotes an external column address strobe signal, symbol Add(E) denotes an external address signal, symbol /WE denotes a write control signal, symbol /RAS(I) denotes an internal row address strobe signal, symbol RAi(I) denotes an internal row address signal, symbol CAi(I) denotes an internal column address signal, symbol Din denotes a data input, and symbol Dout denotes a data output.

Entering a self refresh check mode, an internal refresh operation is performed in a refresh period decided by an internal timer, while a column address is fixed at 0, for example, and a column address system (existing circuit structure) is driven at this time. A data input/output system (existing circuit structure) is driven in response to this, and data input/output is made from the exterior. Due to provision of such a function, the internal refresh operation can be checked as described in (1) to (4):

(1) "0" is written in all column addresses 0 by a general write operation.

(2) As shown in FIG. 14, "1" is written in the external data input Di for a certain constant time T while incrementing, the internal row address signal CAi in the self refresh check mode (timing of a time t1).

(3) All data of the column addresses 0 are read by a general read operation.

If all read data are "1", it is determined that a circulating refresh operation has been performed in a time within the period T.

If there is "0" in part of the read data, it comes to that a time exceeding the period T is required for circulation of the refresh operation, and (2) is performed again in a time of a period T' larger than the period T.

(4) The above is so repeated that the period of the internal refresh operation can be recognized from the exterior and an effective test can be made.

Alternatively, a test can be made in the following method:

(1) "0" and "1" are alternately written while successively incrementing the row address signal RAi at a column address 0 by a general write operation.

(2) As shown in FIG. 15, the write control signal /WE is brought up (time t2) in a self refresh check mode (timing of a time t2) to implement a read mode, and thereafter output data Dout is read while incrementing the internal row address signal RAi.

(3) The period of the internal refresh operation can be recognized from the exterior from the oscillation frequency of the output data Dout.

Processing Content 2

While the period of the internal refresh operation can be recognized in the aforementioned method, it is necessary to independently test a refresh cycle when the refresh cycle is different only with respect to a memory cell of a specific block or row (column) as the spare block or the spare row/column block as the dynamic semiconductor memory device according to each of the embodiments 1 to 5.

Figure 16:
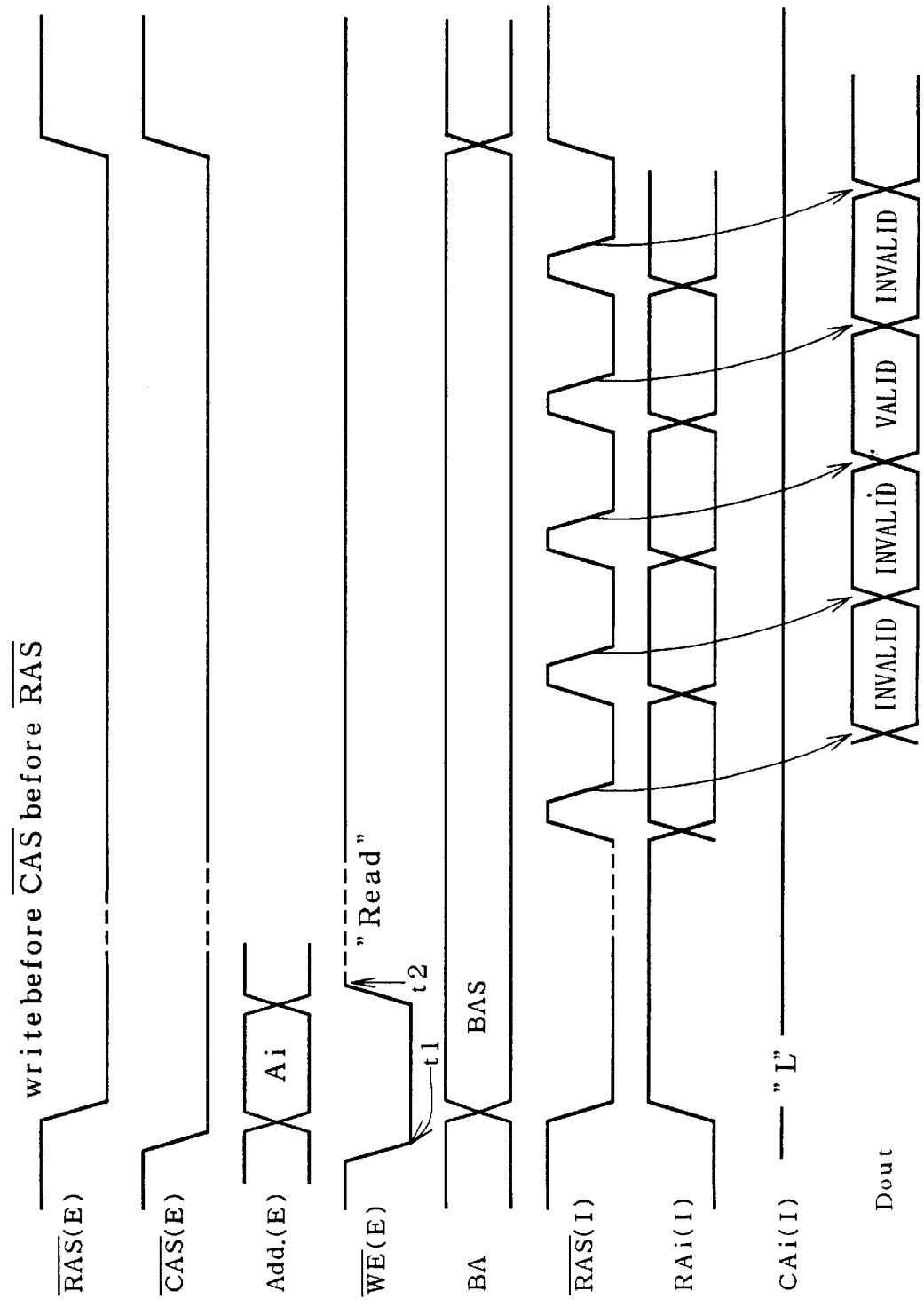
FIG. 16 is a timing chart for illustrating a method of checking an internal refresh cycle for a specific block according to the embodiment 6.

FIG. 16 is a timing chart for illustrating a second check method according to the embodiment 6. Referring to FIG. 16, symbol BA denotes a row address for selecting an external output block. The remaining signals are identical to those in FIGS. 14 and 15.

(1) As shown in FIG. 16, a write control signal /WE is brought up (time t2) in a self refresh check mode (timing of a time t1) to implement a read mode, and thereafter the block selection row address BA (=BAS) is set so that output data Dout can be outputted only in a specific block (spare cell array block SBLK or the like).

(2) The output data Dout is read while incrementing an internal row address signal RAi. At this time, a determination is made as to in what ratio effective output data Dout is outputted.

In case of the structure of the embodiment 1, for example, effective output data Dout is read in the ratio of once to eight times as to the spare cell array block SBLK, and in the ratio of once to 16 times as to the remaining blocks.

Effect

When the semiconductor memory device has refresh cycles which are varied with programs or memory array blocks, operations thereof can be accurately read from the exterior.

Embodiment 7

Premise

As a structure capable of attaining effects similar to those of the embodiments 1 and 2, generally conceivable is a structure comprising (N+1) memory array blocks, implementing a structure selecting and activating arbitrary N blocks among the same, and reducing the refresh cycle in a block having the most inferior data retention ability among the activated ones.

Structure and Operation

Figure 17:
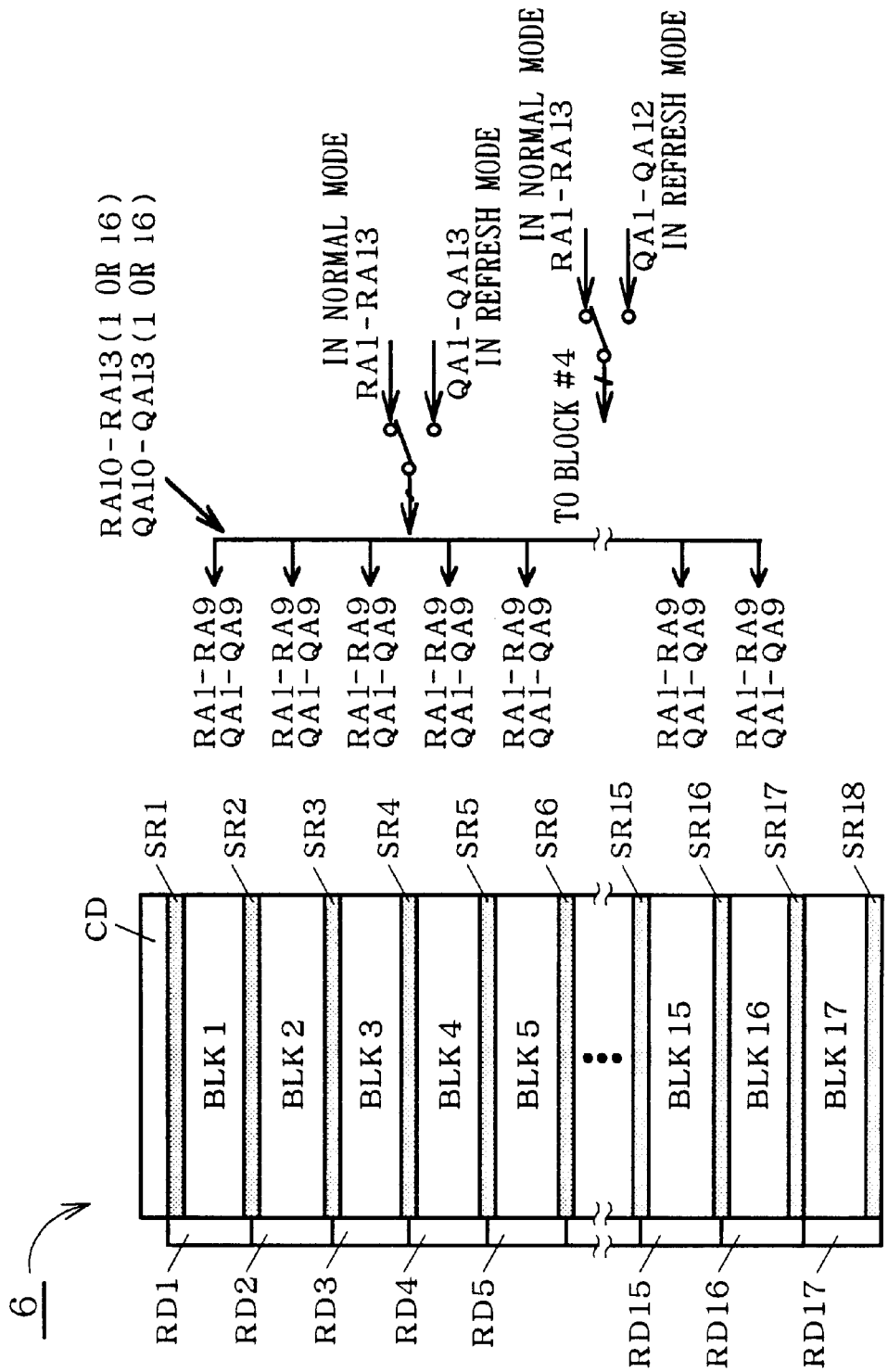
FIG. 17 is an explanatory diagram showing the concept of a dynamic semiconductor memory device according to an embodiment 7 of the present invention.

FIG. 17 is an explanatory diagram showing the concept of a dynamic semiconductor memory device according to an embodiment 7 of the present invention. As shown in FIG. 17, a memory cell array 6 is divided into normal cell array blocks BLK1 to BLK17. Sense amplifier zones SRi and SR(i+1) are provided on both sides (vertical direction in FIG. 17) of each normal cell array block BLKi (i=1 to 17), and each sense amplifier zone SRj (i=2 to 17) is shared by normal cell array blocks BLK(j−1) and BLKj.

A column decoder CD is provided for the memory cell array 6, and row decoders RD1 to RD17 are provided for the normal cell array blocks BLK1 to BLK17 respectively. In each normal cell array block BLKi (i=1 to 17), memory cells are arranged in the form of a matrix, with arrangement of word lines for row selection of the memory cells and bit lines for reading/writing data from/in the memory cells.

In such a structure, it is assumed that the normal cell array blocks BLK1 to BLK16 are employed in an initial state, and the normal cell array block BLK4 has the most inferior data retention ability among these blocks.

The embodiment is so devised that the normal cell array blocks BLK1 to BLK3 and BLK5 to BLK16 are refreshed in 8 kc, while the normal cell array block BLK4 is refreshed in 4 kc in this case.

The structure of the embodiment 7 is similar to that of the embodiment 2 shown in FIG. 5, while the internal structure of a block address decoder 12B is different. The internal structure of the block address decoder 12B according to the embodiment 7 is obtained by providing the circuit structure (the AND gate GS, the OR gates G51 and G52, the control signal CS etc.) for the spare block selection signal BBS in the block address decoder 12 according to the embodiment 1 shown in FIG. 3 for every one of the normal cell array blocks BLK1 to BLK17.

While the structure of the embodiment 7 corresponds to the embodiment 2, this embodiment may alternatively correspond to each of the embodiments 1 and 3 to 5, for reducing the refresh cycle in (a row of) an arbitrary activated block.

Effect

Thus, the dynamic semiconductor memory device according to the embodiment 7 renders any array block BLKp (p=any of 1 to 17) having the most inferior data retention ability among activated ones of the plurality of normal cell array blocks BLK1 to BLK17 refreshable at a short refresh interval, to be sufficiently capable of a normal operation. Consequently, the success rate for defect repair is increased and the yield is improved.

Embodiment 8

Premise

Also possible is a structure obtained by developing the point of the present invention shown in the embodiment 1, comprising N memory array blocks, using all these N blocks, and reducing the refresh cycle in a block having the most inferior data retention ability. If a defect is present, defect repair in the unit of a spare row/column is made in the unit of each block by an existing method, and thereafter the refresh cycle is reduced as to the block having the most inferior data retention ability.

Structure and Operation

Figure 18:
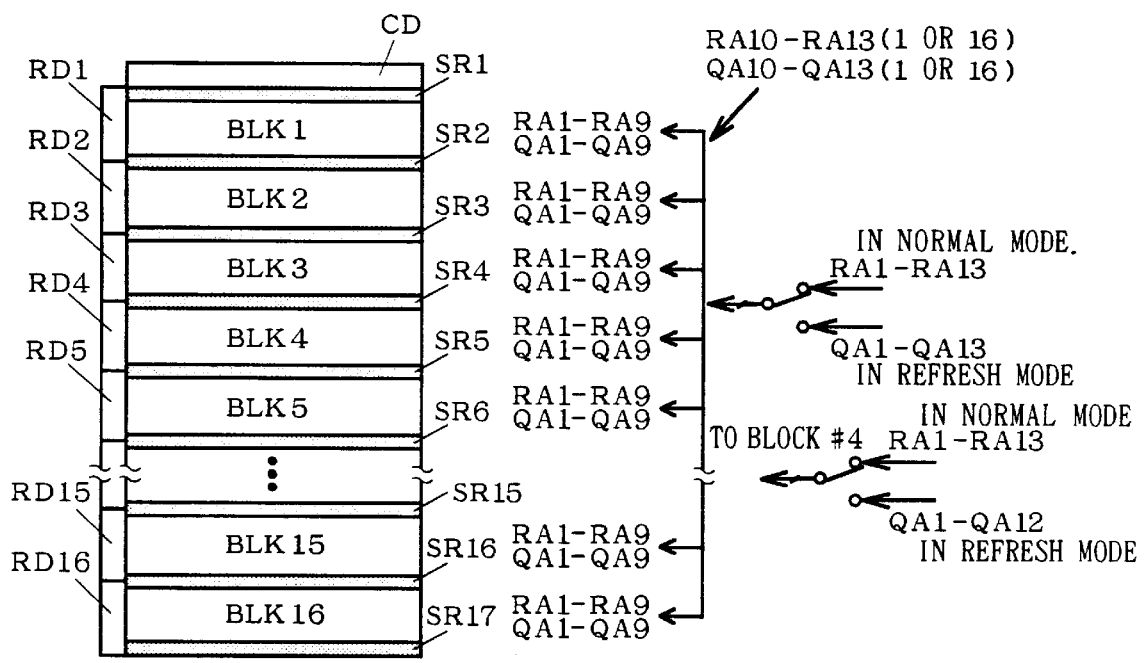
FIG. 18 is an explanatory diagram showing the concept of a dynamic semiconductor memory device according to an embodiment 8 of the present invention.

FIG. 18 is an explanatory diagram showing the concept of a dynamic semiconductor memory device according to an embodiment 8 of the present invention. As shown in FIG. 18, a memory cell array 6 is divided into normal cell array blocks BLK1 to BLK16. Parts similar to those in FIG. 17 are denoted by the same reference numerals, to properly omit redundant description.

In such a structure, it is assumed that all normal cell array blocks BLK1 to BLK16 are employed in an initial state, and the normal cell array block BLK4 has the most interior data retention ability.

This embodiment is so devised that the normal cell array blocks BLK1 to BLK3 and BLK5 to BLK16 are refreshed in 8 kc, while the normal cell array block BLK4 is refreshed in 4 kc in this case.

The structure of the embodiment 8 is similar to that of the embodiment 2 shown in FIG. 5, while the internal structure of a block address decoder 12B is different. The internal structure of the block address decoder 12B according to the embodiment 8 is obtained by providing the circuit structure (the AND gate GS, the OR gates G51 and G52, the control signal CS etc.) for the spare block selection signal BBS in the block address decoder 12 according to the embodiment 1 shown in FIG. 3 for every one of the normal cell array blocks BLK1 to BLK16.

While the structure of the embodiment 8 corresponds to the embodiment 2, this embodiment may alternatively correspond to each of the embodiments 1 and 3 to 5, for reducing the refresh cycle in (a row of) an arbitrary activated block.

Effect

Thus, the dynamic semiconductor memory device according to the embodiment 8 renders any array block BLKp (p=any of 1 to 16) having the most inferior data retention ability among activated ones of the plurality of normal cell array blocks BLK1 to BLK16 refreshable at a short refresh interval, to be sufficiently capable of a normal operation. Consequently, the success rate for defect repair is increased and the yield is improved.

Further, all normal cell array blocks BLK1 to BLK16 are employed, whereby the embodiment 8 is superior in efficiency to the embodiment 7.

Embodiment 9

Figure 19:
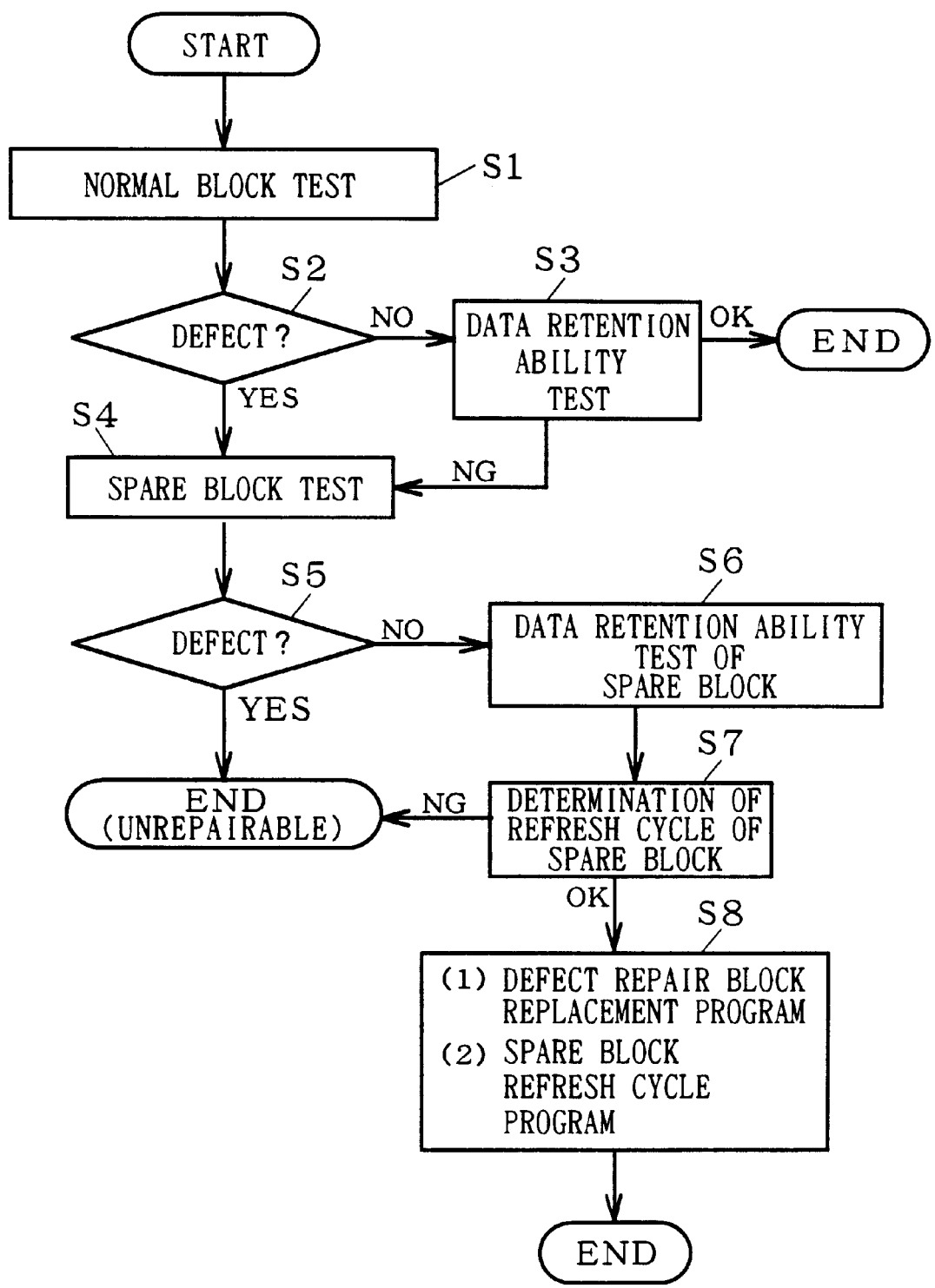
FIG. 19 is a flow chart showing a defect repair method for a semiconductor memory device according to an embodiment 9 of the present invention.

An embodiment 9 of the present invention is directed to a method of effectively making defect repair, a test and a confirmation algorithm in a memory cell array as to the structure shown in each of the embodiments 1 to 5. FIG. 19 is a flow chart showing a defect repair method for a semiconductor memory device according to the embodiment 9.

The flow of the processing is now described with reference to FIG. 19. For the convenience of illustration, the following description is made with reference to the dynamic semiconductor memory device according to the embodiment 1 shown in FIGS. 1 to 3.

At a step S1, a test is made as to whether or not a memory cell in any block has a defect with respect to the normal cell array blocks BLK1 to BLK16. The process advances to a step S3 if the determination is of NO at a step S2, while advancing to a step S4 if the determination is of YES.

At the step S3, a data retention ability test is made on the normal cell array blocks BLK1 to BLK16, and the process is ended if there is no abnormality (OK) since no block requiring defect repair is present, while the process advances to the step S4 if there is abnormality (NG).

At the step S4, a test is made on the spare cell array block SBLK as to whether or not there is a defect in a memory cell in the block. The process advances to a step S6 if a determination is made at a step S5 that there is no defect, while the process is ended if a determination is made that there is a defect, due to unrepairability.

At the step S6, a data retention ability test is made on the spare cell array block SBLK, excellence/non-excellence of the data retention ability (may be lower than a general one) of the spare cell array block SBLK is determined at a step S7, and the process advances to a step S8 if the data retention ability is excellent (OK), while the process is ended if the data retention ability is non-excellent (NG) due to unrepairability. The data retention ability required to the spare cell array block SBLK is at a level refreshable in a relatively loose refresh cycle such as 4 kc.

At the step S8, the block determined as defective is replaced with the spare cell array block SBLK, the refresh cycle for the spare cell array block SBLK is set at a short cycle, and the process is ended.

Effect

This embodiment implements a defect repair method for any of the dynamic semiconductor memory devices according to the embodiments 1 to 5. In this case, high-precision defect repair can be performed also with evaluation of data retention ability.

Embodiment 10

Premise

In general, a highly integrated DRAM memory cell array at a level exceeding 64 MB has a sense amplifier layout of alternate arrangement in order to enlarge the layout pitch for sense amplifiers, as well as a shared sense amplifier structure sharing sense amplifiers between adjacent blocks, in order to reduce the chip size.

In case of such a structure, it is basically impossible to simultaneously activate adjacent blocks. In case of a structure having a spare block for defect repair, therefore, there is such a possibility that the spare block repairs all normal blocks in the conventional structure. Thus, the shared sense amplifier structure for sharing sense amplifiers with the normal blocks is impossible as to the spare block, the spare block must independently have a sense amplifier, and the chip area is disadvantageously increased.

Structure and Operation

First Mode

Figure 20:
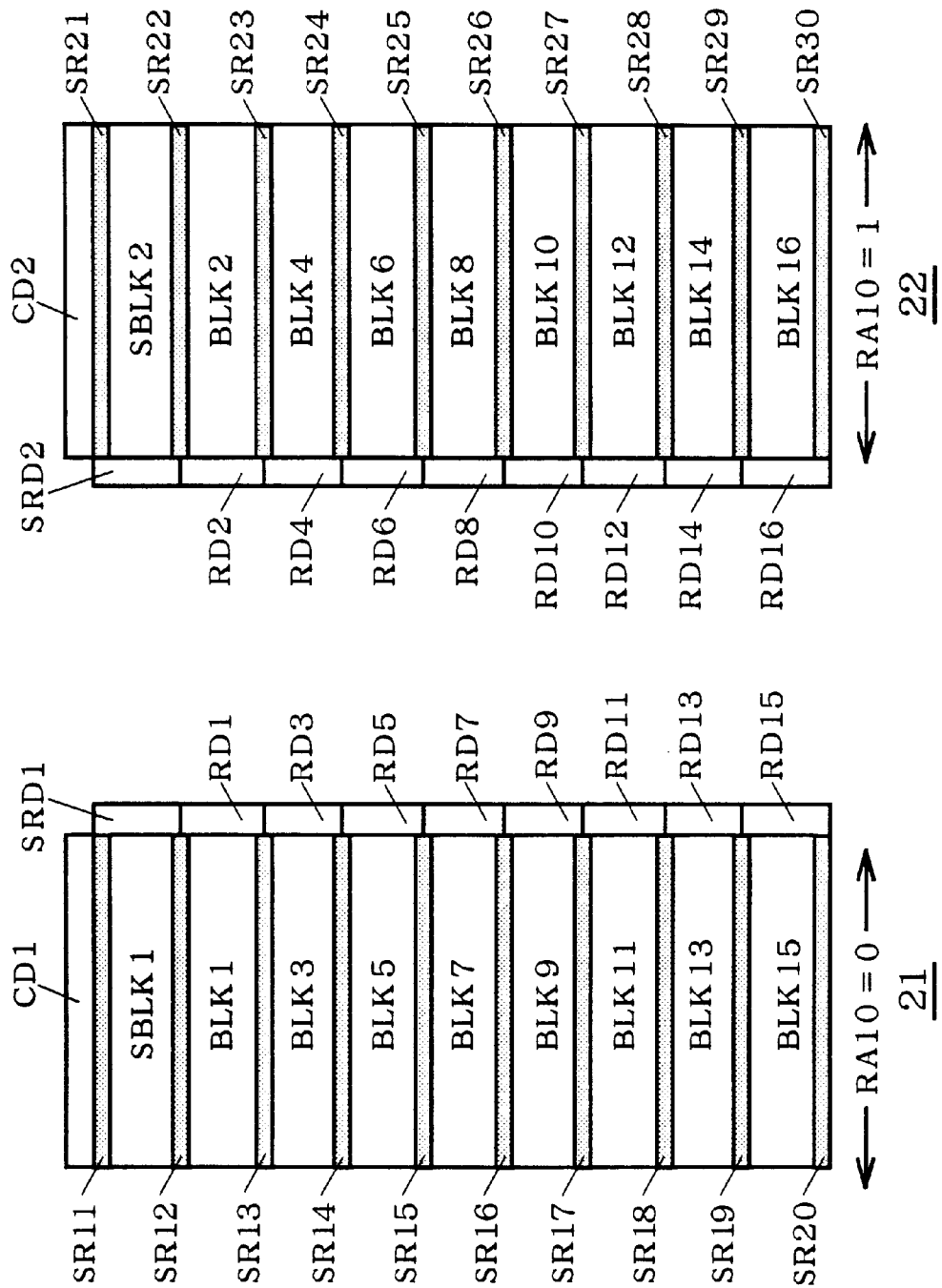
FIG. 20 is an explanatory diagram showing the concept of a first mode of a dynamic semiconductor memory device according to an embodiment 10 of the present invention.

FIG. 20 is a conceptual diagram showing the concept of a dynamic semiconductor memory device according to a first mode of an embodiment 10 of the present invention. As shown in FIG. 20, the dynamic semiconductor memory device according to the embodiment 10 is formed by two partial memory cell arrays 21 and 22. The partial memory cell array 21 is formed by a spare cell array block SBLK1 and normal cell array blocks BLK1, BLK3, . . . , BLK13 and BLK15, and the partial memory cell array 2 is formed by a spare cell array block SBLK2 and normal cell array blocks BLK2, BLK4, . . . , BLK14 and BLK16.

A column decoder CD1 is provided for the partial memory cell array 21, row decoders RD1, RD3, . . . , RD15 are provided for the normal cell array blocks BLK1, BLK3, . . . , BLK15 respectively, and a spare row decoder SRD1 is provided for the spare cell array block SBLK1.

On the other hand, a column decoder CD2 is provided for the partial memory cell array 22, row decoders RD2, RD4, . . . RD16 are provided for the normal cell array blocks BLK2, BLK4, . . . , BLK16 respectively, and a spare row decoder SRD2 is provided for the spare cell array block SBLK2.

In the partial memory cell array 21, sense amplifier zones SR12 to SR20 formed with sense amplifiers (not shown) are provided on both sides (vertical direction in FIG. 20) of the normal cell array blocks BLK1, BLK3, . . . , BLK15 respectively, and each adjacent pair of normal cell array blocks BLKr (r=odd numbers 1 to 15) and BLK(r+2) share each sense amplifier zone SR provided therebetween. The spare cell array block SBLK1 shares a sense amplifier zone SR11 with the normal cell array block BLK1.

In the partial memory cell array 22, on the other hand, sense amplifier zones SR22 to SR30 formed with sense amplifiers (not shown) are provided on both sides (vertical direction in FIG. 20) of the normal cell array blocks BLK2, BLK4, . . . , BLK16 respectively, and each adjacent pair of normal cell array blocks BLKs (s=even numbers 2 to 16) and BLK(s+2) share each sense amplifier zone SR provided therebetween. The spare cell array block SBLK2 shares a sense amplifier zone SR21 with the normal cell array block BLK2.

Figure 21:
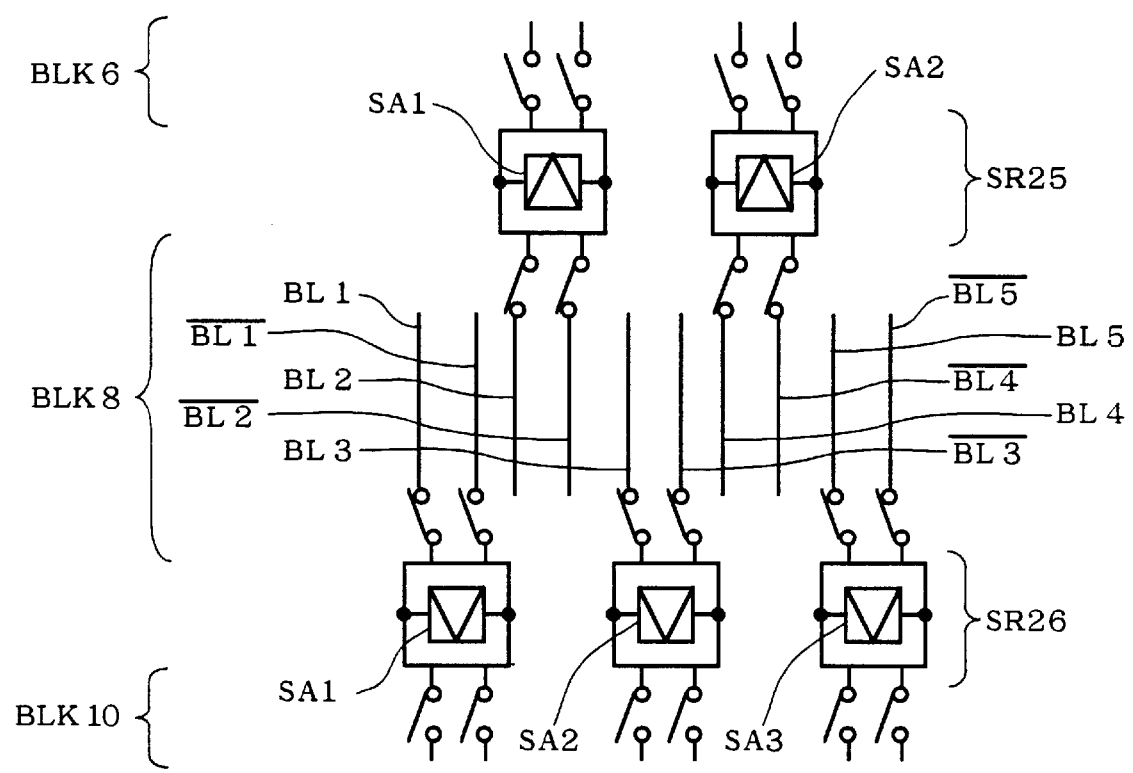
FIG. 21 is a circuit diagram for illustrating an operation of the first mode according to the embodiment 10.

For example, the normal cell array blocks BLK6 and BLK8 share the sense amplifier zone SR25 provided therebetween, and the normal cell array blocks BLK8 and BLK10 share the sense amplifier zone SR26 provided therebetween. When the normal cell array block BLK8 is selected, sense amplifiers SA1 to SA3 of the sense amplifier zone SR26 are employed for bit line pairs BL1 and /BL1, BL3 and /BL3 and BL5 and /BL5 respectively, and sense amplifiers SA1 and SA2 of the sense amplifier zone SR25 are employed for bit line pairs BL2 and /BL2 and BL4 and /BL4 respectively, as shown in FIG. 21.

The normal cell array blocks BLK1, BLK3, . . . , BLK15 of the partial memory cell array 21 and the normal cell array blocks BLK2, BLK4, . . . , BLK16 are previously addressed as blocks addressed by a row address signal RA10="0" and a row address signal RA10="1" respectively.

An address control system according to the first mode of the embodiment 10 is similar in structure to that of the embodiment 1 shown in FIG. 2, while the structure of a block address decoder 12 is different. The internal structure of the block address decoder 12 according to the embodiment 10 is obtained by providing the circuit structure (the AND gate GS, the OR gates G51 and G52, the control signal CS and the like) for the spare block selection signal BBS in the block address decoder 12 according to the embodiment 1 shown in FIG. 3 for each of the two spare cell array blocks SBLK1 and SBLK2.

If any of the normal cell array blocks BLK1, BLK3, . . . , BLK15 of the partial memory cell arrays 21 has a defect in such a structure, this defective block is replaced with the spare cell array block SBLK2 of the partial memory cell array 22. If any of the normal cell array blocks BLK2, BLK4, . . . , BLK16 of the partial memory cell array 22 has a defect, on the other hand, this defective block is replaced with the spare cell array block SBLK1 of the partial memory cell array 21.

Thus, the spare cell array block SBLK1 necessarily substitutes for any normal cell array block BLK of the partial memory cell array 22 addressed by RA10="1", whereby the normal cell array block BLK1 addressed by RA10="0" necessarily enters a non-selected state when the spare cell array block SBLK1 is selected, and no competitive use of the sense amplifier zone SR11 takes place between the spare cell array block SBLK1 and the normal cell array block BLK1.

Similarly, the spare cell array block SBLK2 necessarily substitutes for any normal cell array block BLK of the partial memory cell array 21 addressed by RA10="0", whereby the normal cell array block BLK2 addressed by RA10="1" necessarily enters a non-selected state when the spare cell array block SBLK2 is selected, and no competitive use of the sense amplifier zone SR21 takes place between the spare cell array block SBLK2 and the normal cell array block BLK2.

Second Mode

Figure 22:
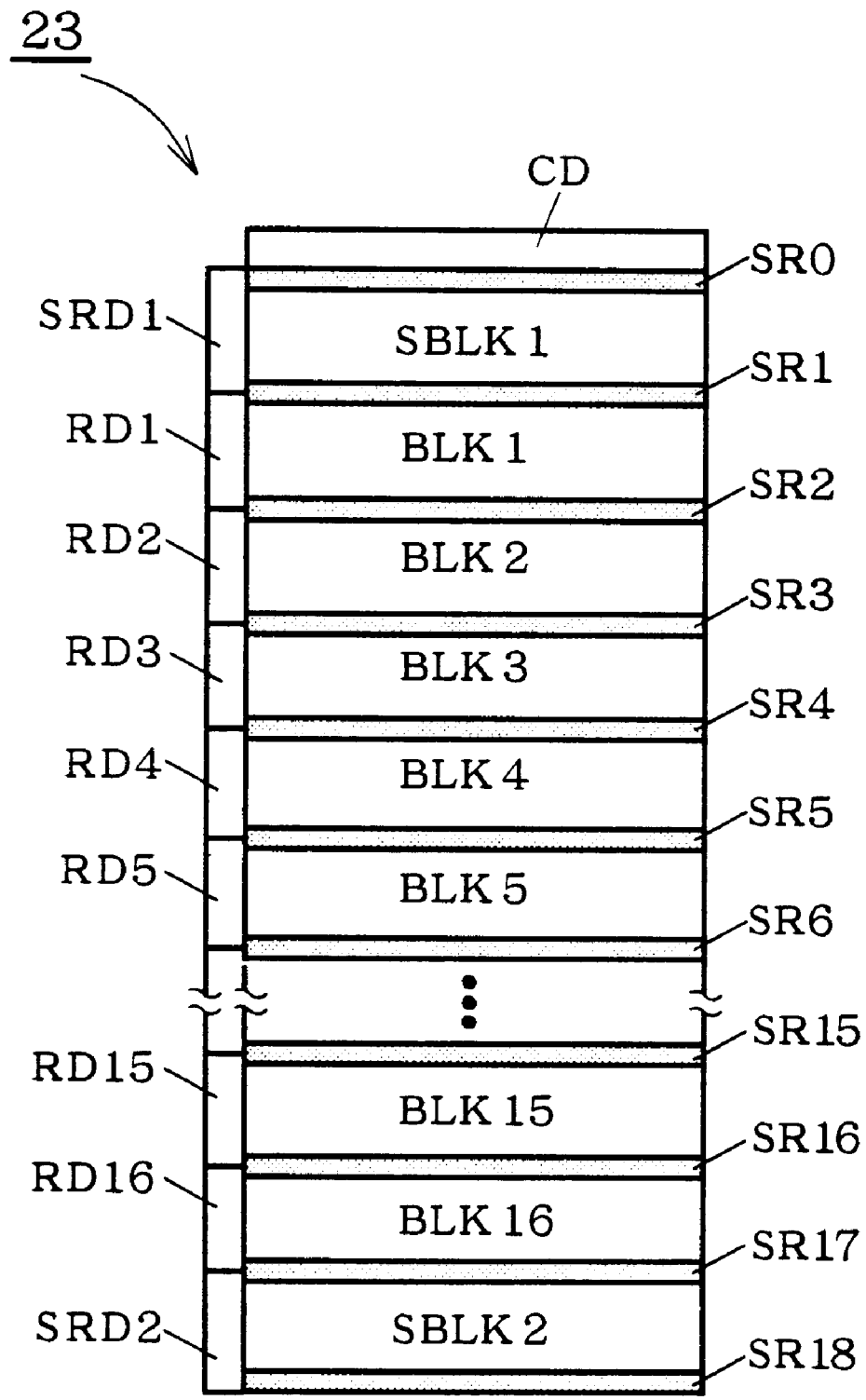
FIG. 22 is a circuit diagram showing a second mode of the dynamic semiconductor memory device according to the embodiment 10.

FIG. 22 is an explanatory diagram showing the concept of a dynamic semiconductor memory device according to a second mode of the embodiment 10 of the present invention. As shown in FIG. 22, a memory cell array 23 of the semiconductor memory device according to the second mode of the embodiment 10 is formed by spare cell array blocks SBLK1 and SBLK2 and normal cell array blocks BLK1 to BLK16.

A column decoder CD is provided for the memory cell array 23, row decoders RD1 to RD16 are provided for the normal cell array blocks BLK1 to BLK16 respectively, and spare row decoders SRD1 and SRD2 are provided for the spare cell array blocks SBLK1 and SBLK2 respectively.

Sense amplifier zones SRi and SR(i+1) formed with sense amplifiers (not shown) are provided on both sides (vertical direction in FIG. 22) of each normal cell array block BLKi (i=1 to 16), and each sense amplifier SRj (j=2 to 16) is shared by normal cell array blocks BLK(j−1) and BLKj.

Sense amplifier zones SR0 and SR1 are provided also on both sides of the spare cell array block SBLK1, while sense amplifier zones SR17 and SR18 are also provided on both sides of the spare cell array block SBLK2. The spare cell array block SBLK1 shares the sense amplifier zone SR1 with the normal cell array block BLK1, and the spare cell array block SBLK2 shares the sense amplifier zone SR17 with the normal cell array block BLK16.

Figure 23:
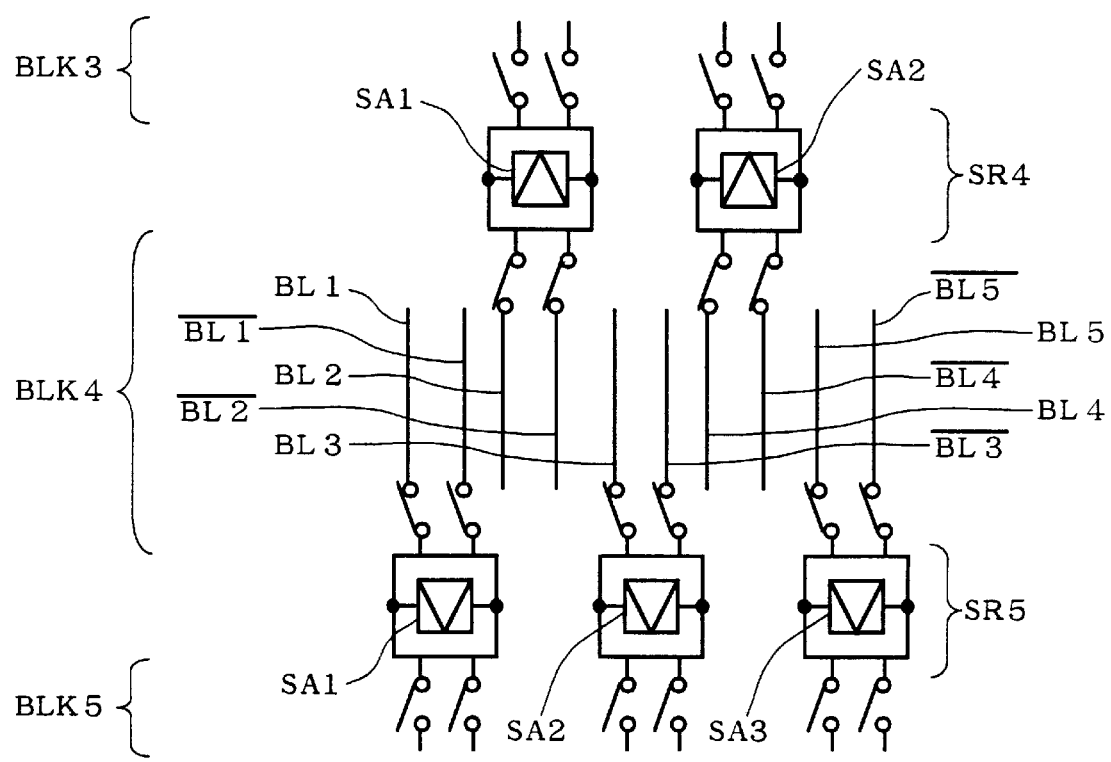
FIG. 23 is a circuit diagram for illustrating an operation of the second mode according to the embodiment 10.

For example, the normal cell array blocks BLK3 and BLK4 share the sense amplifier zone SR4 provided therebetween, and the normal cell array blocks BLK4 and BLK5 share the sense amplifier zone SR5 provided therebetween. When the normal cell array block BLK4 is selected, sense amplifiers SA1 to SA3 of the sense amplifier zone SR5 are employed for bit line pairs BL1 and /BL1, BL3 and /BL3 and BL5 and /BL5 respectively, and sense amplifiers SA1 and SA2 of the sense amplifier zone SR4 are employed for bit line pairs BL2 and /BL2 and BL4 and /BL4 respectively, as shown in FIG. 23.

Also in the second mode, the normal cell array blocks BLK1, BLK3, . . . , BLK15 of the memory cell array 23 are blocks addressed by a row address signal RA10="0", and the normal cell array blocks BLK2, BLK4, . . . , BLK16 are blocks addressed by a row address signal RA10="1".

The structure of an address control system according to the second mode of the embodiment 10 is similar to that of the first mode.

If any of the normal cell blocks BLK1, BLK3, . . . , BLK15 has a defect in such a structure, this defective block is replaced with the spare cell array block SBLK2. If any of the normal cell array blocks BLK2, BLK4, . . . , BLK16 has a defect, on the other hand, this defective block is replaced with the spare cell array block SBLK1.

Thus, the spare cell array block SBLK1 necessarily substitutes for any of the normal cell array blocks BLK2, BLK2, . . . , BLK16 addressed by RA10="1", whereby the normal cell array block BLK1 addressed by RA10="0" necessarily enters a non-selected state when the spare cell array block SBLK1 is selected, and no competitive use of the sense amplifier zone SR1 takes place between the spare cell array block SBLK1 and the normal cell array block BLK1.

Similarly, the spare cell array block SBLK2 necessarily substitutes for any of the normal cell array blocks BLK1, BLK3, . . . , BLK15 addressed by RA10="0", whereby the normal cell array block BLK2 addressed by RA10="1" necessarily enters a non-selected state when the spare cell array block SBLK2 is selected, and no competitive use of the sense amplifier zone SR17 takes place between the spare cell array block SBLK2 and the normal cell array block BLK16.

Effect

In the dynamic semiconductor memory device according to the embodiment 10, no competition of the sense amplifier takes place between the spare cell array block and the normal cell block adjacent thereto despite formation of the shared sense amplifier structure sharing the sense amplifier between the spare cell array block and the normal cell array block, whereby improvement of the degree of integration can be attained by taking the shared sense amplifier structure including the spare cell array block.

The second mode employing the structure in one column decoder can attain higher improvement of the degree of integration since the same may not be provided with two column decoders CD1 and CD2 dissimilarly to the first mode. In addition, different column decoders must be newly activated in case of selecting a defective block in the first mode, while simplification of control can be attained in the second mode due to absence of such necessity.

Embodiment 11

Figure 24:
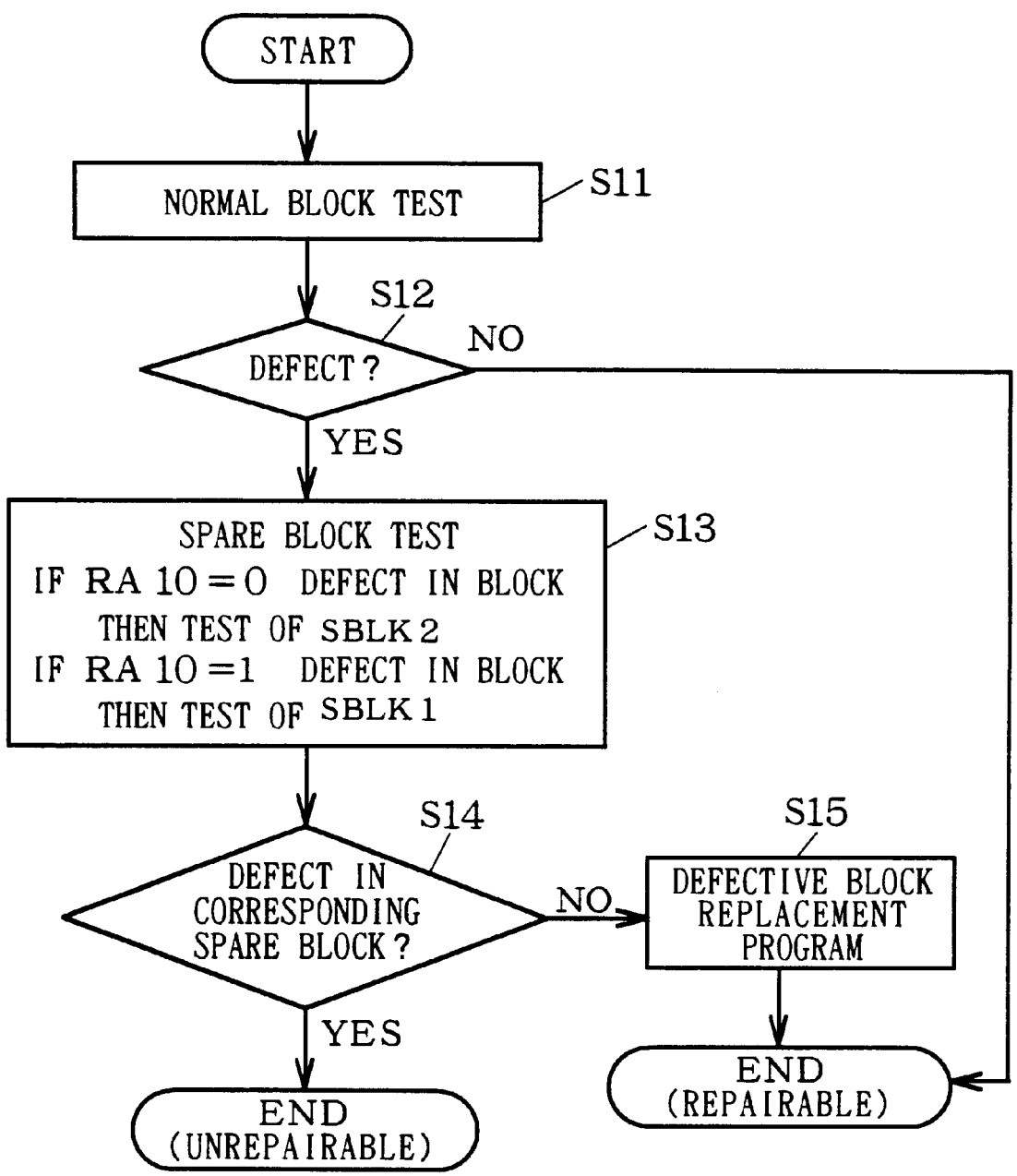
FIG. 24 is a flow chart showing a defect repair method for a semiconductor memory device according to an embodiment 11 of the present invention.

FIG. 24 is a flow chart showing a defect repair method for a semiconductor memory device according to an embodiment 11 of the present invention. This method is directed to the dynamic semiconductor memory device having the structure described with reference to the embodiment 10.

Referring to FIG. 24, a test is made at a step S11 on the normal cell array blocks BLK1 to BLK16 as to whether or not a memory cell in any block has a defect. The process is ended if a determination is made at a step S12 that there is no defect since no block requiring defect repair is present, while the process advances to a step S13 if a determination is made that there is a defect.

At the step S13, a test is made on the spare cell array block SBLK1 or SBLK2 as to whether or not there is a defect in a memory cell of the block. The spare cell array block SBLK2 is tested if any of the normal cell array blocks BLK1, BLK3, . . . , BLK15 (RA10="0") has a defect, while the spare cell array block SBLK1 is tested if any of the normal cell array blocks BLK2, BLK4, . . . , BLK16 (RA10="1") has a defect.

The process advances to a step S15 if a determination is made that there is no defect in the spare cell block SBLK (SBLK1 or SBLK2) at a step S14, while the process is ended due to unrepairability if there is a defect.

At the step S15, the block determined as defective is replaced with the spare cell array block SBLK and the process is ended. If any of the normal cell array blocks BLK1, BLK3, . . . , BLK15 has a defect, this defective block is replaced with the spare cell array block SBLK2. If any of the normal cell array blocks BLK2, BLK4, . . . , BLK16 has a defect, on the other hand, this defective block is replaced with the spare cell array block SBLK1.

Effect

This embodiment implements a defect repair method for the dynamic semiconductor memory device according to the embodiment 10. In this case, only one of the spare cell array blocks SBLK1 and SBLK2 is tested, whereby an efficient test can be made.

Embodiment 12

Premise

Conceivable is a structure obtained by developing the idea of the embodiment 7 to comprise (N+1) memory array blocks of a shared sense amplifier structure for selecting and activating N blocks having normal memory cells.

Structure and Operation

Figure 25:
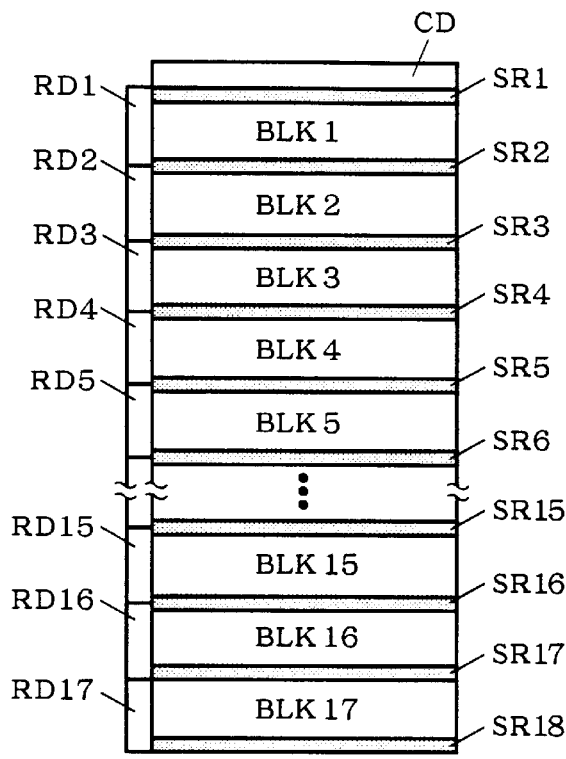
FIG. 25 is an explanatory diagram showing the concept of a dynamic semiconductor memory device according to an embodiment 12 of the present invention.
Figure 26:
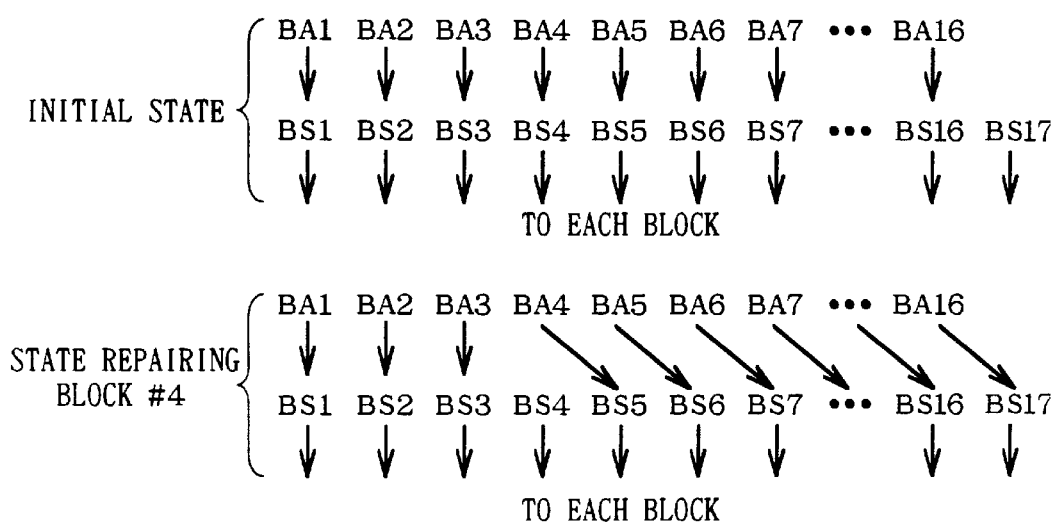
FIG. 26 is an explanatory diagram showing a control operation of a block decoder according to the embodiment 12.

FIGS. 25 and 26 are explanatory diagrams showing the concept of a dynamic semiconductor memory device according to an embodiment 12 of the present invention. As shown in FIG. 25, a memory cell array 6 is divided into normal cell array blocks BLK1 to BLK17. Sense amplifier zones SRi and SR(i+1) formed with sense amplifiers (not shown) are provided on both sides of each normal cell array block BLKi (i=1 to 17), and each sense amplifier zone SRj (j=2 to 17) is shared by normal cell array blocks BLK(j-1) and BLKj. Parts similar to those in FIG. 17 are denoted by the same reference numerals, to properly omit redundant description.

In such a structure, it is assumed that the normal cell array blocks BLK1 to BLK16 which are an accessed block group in an initial state are used and the normal cell array block BLK17 is unused in the initial state. Namely, block selection signals BS1 to BS16 are activated by addressing of block addresses BA1 to BA16 respectively.

When the normal cell array block BLK4 has a defect, this normal cell array block BLK4 is omitted and the normal cell array block BLK17 is employed, as shown in FIG. 26. Namely, the block selection signals BS1 to BS3 are activated by addressing of the block addresses BA1 to BA3 respectively, and the block selection signals BS5 to BS17 are activated by addressing of the block addresses BA4 to BA16 respectively.

A row address control system according to the embodiment 12 is similar in structure to that of the embodiment 1 shown in FIG. 2, while the internal structure of a block address decoder 12 is different. The internal structure of the block address decoder 12 according to the embodiment 12 is obtained by providing the circuit structure (the AND gate GS, the OR gates G51 and G52, the control signal CS and the like) for the spare block selection signal BBS in the block address decoder 12 according to the embodiment 1 shown in FIG. 3 for every one of normal cell array blocks SBLK1 to BLK17.

Effect

Thus, the dynamic semiconductor memory device according to the embodiment 12 is formed in the shared sense amplifier structure so that the block address decoder 12 outputs the block selection signals BS1 to BS17 to remove any array block BLKp (p=any of 1 to 17) having a defect, whereby no competition of sense amplifiers takes place between adjacent normal blocks and hence the degree of integration can he improved.

Embodiment 13

Figure 27:
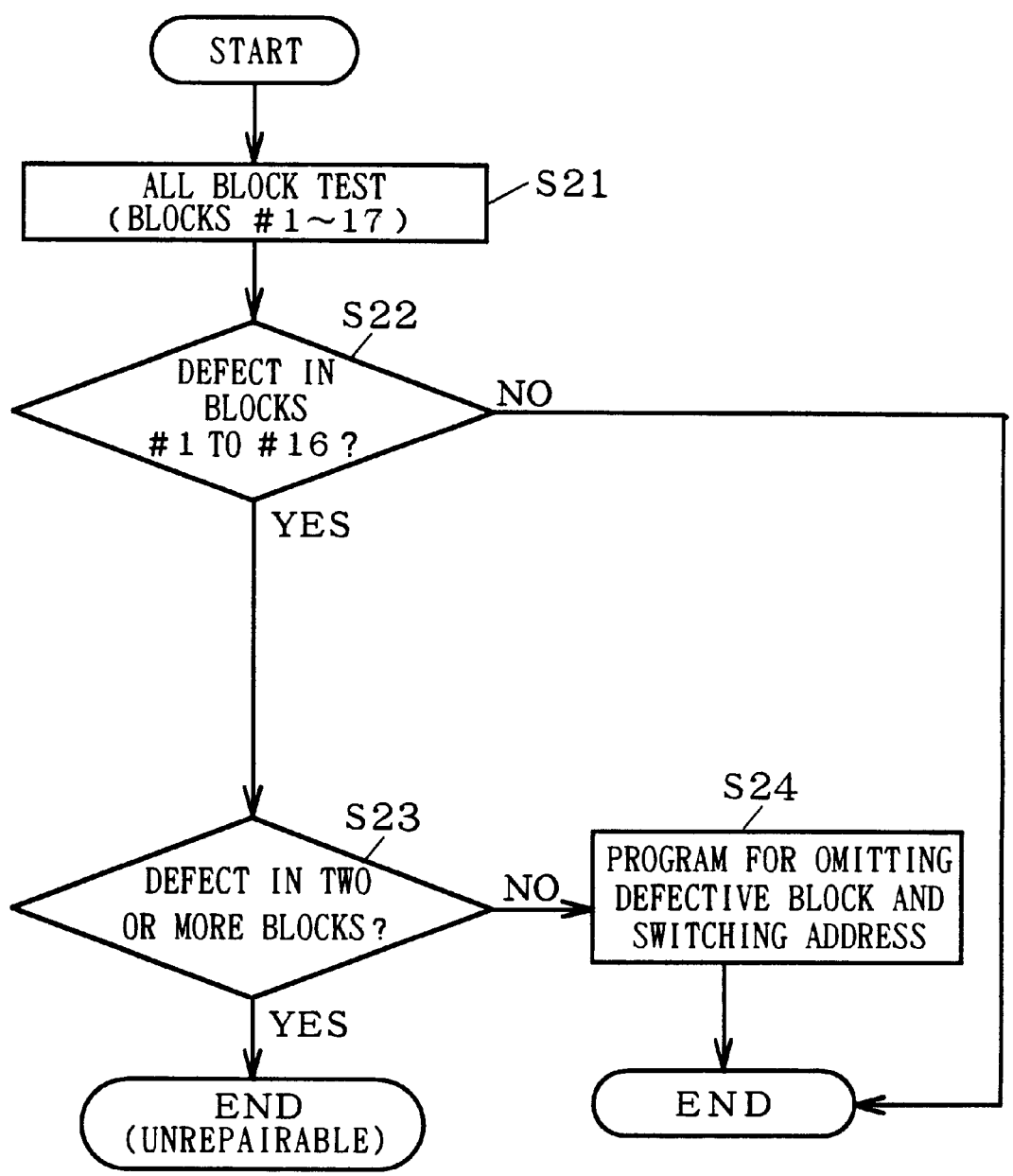
FIG. 27 is a flow chart showing a defect repair method for a semiconductor memory device according to an embodiment 13 of the present invention.
Figure 28:
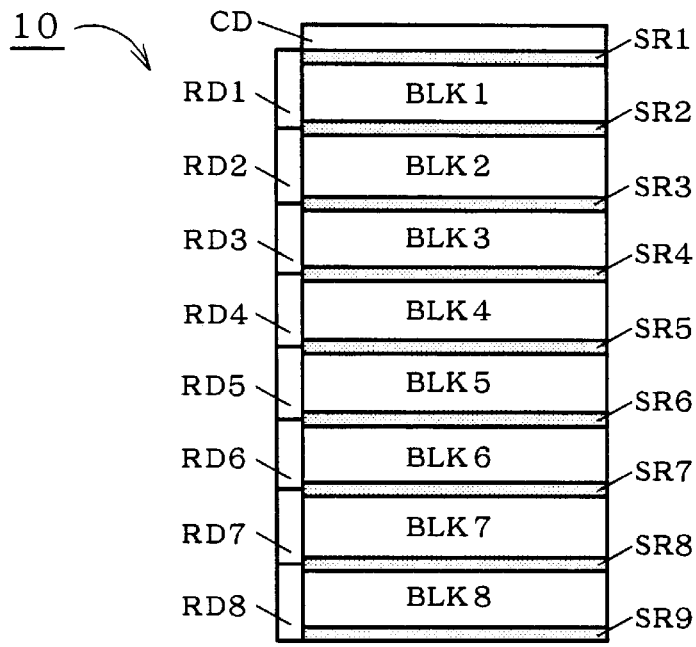
FIG. 28 is an explanatory diagram showing a conventional memory array structure.
Figure 29:
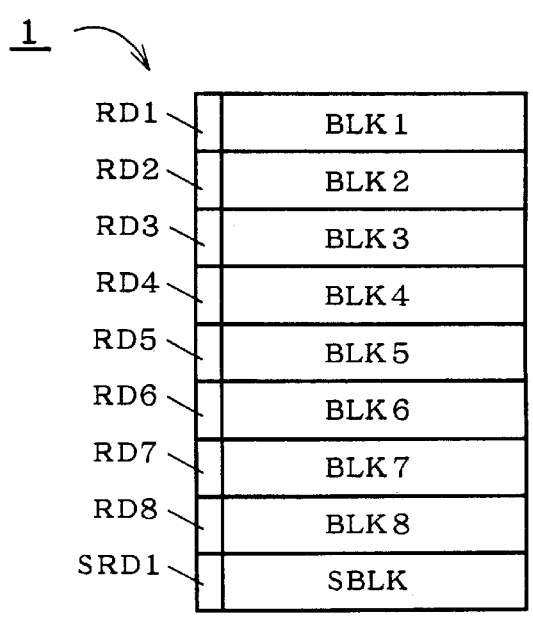
FIG. 29 is an explanatory diagram showing a conventional memory cell array structure provided with a spare cell array block.
Figure 30:
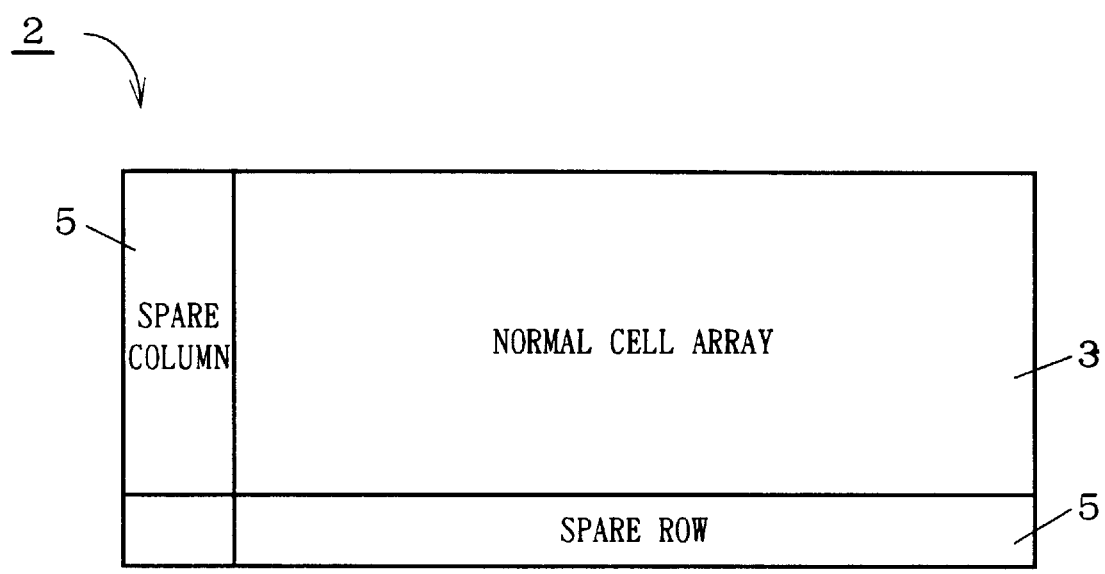
FIG. 30 is an explanatory diagram showing a conventional memory cell array provided with a spare row and a spare column.

FIG. 27 is a flow chart showing a defect repair method for a semiconductor memory device according to an embodiment 13 of the present invention. This method is directed to the dynamic semiconductor memory device having the structure described with reference to the embodiment 12.

Referring to FIG. 24, a test is made at a step S21 on all normal cell array blocks BLK1 to BLK17 as to whether or not a memory cell in any block has a defect. The process is ended if a determination is made at a step S22 that there is no defect in the normal cell array blocks BLK1 to BLK16 used in the initial state since no defect repair is required, while the process advances to a step S23 if a determination is made that there is a defect.

At the step S23, a test is made as to whether or not two or more blocks including the normal cell array block BLK17 have defects, and the process is ended if there are two or more defective blocks due to unrepairability, while the process advances to a step S24 if one block has a defect.

At the step S24, the block determined as defective is omitted, addressing is switched and the process is ended. If the normal cell array block BLK4 has a defect, for example, this block BLK4 is replaced with the normal cell array block BLK17 not used in the initial state, and the addressing is changed as shown in FIG. 26.

Effect

This embodiment implements a defect repair method for the dynamic semiconductor memory device according to the embodiment 12.

While the invention has been shown and described in detail, the foregoing description is in all aspects illustrative and not restrictive. It is therefore understood that numerous modifications and variations can be devised without departing from the scope of the invention.

I claim:

1. A semiconductor memory device comprising:
   a memory cell array having a plurality of cell array blocks each being formed by dividing a plurality of memory cells, adjacent ones of said plurality of cell array blocks sharing sense amplifiers; and
   block access means for accessing part of said plurality of cell array blocks excluding an initial unused block group as an accessed block group in an initial state while accessing a block in said initial unused block group having no possibility of competitively using said shared sense amplifier after replacement in place of a defective block having a defective memory cell being included in said accessed block group.

2. The semiconductor memory device in accordance with claim 1, wherein
   said plurality of memory cells include a plurality of normal memory cells and a plurality of spare memory cells,
   said plurality of cell array blocks include first and second spare cell array blocks being formed by dividing said plurality of spare memory cells and a plurality of normal cell array blocks each being formed by dividing said plurality of normal memory cells, said accessed block group includes said plurality of normal cell array blocks, and said initial unused block group includes said first and second spare cell array blocks,
   each of said first and second spare cell blocks share a sense amplifier with at least one block among said plurality of normal cell array blocks, and
   said block access means accesses one of said first and second spare cell array blocks having no possibility of competitively using said shared sense amplifier after replacement in place of a defective block having a defective normal memory cell among said plurality of normal cell array blocks.

3. The semiconductor memory device in accordance with claim 2, wherein
   said memory cell array has first and second partial memory cell arrays, and said plurality of normal cell array blocks have a plurality of first normal cell array blocks and a plurality of second normal cell array blocks, said first partial memory cell array has said first spare cell array block and said plurality of first normal cell array blocks, and said first spare cell array block shares a sense amplifier with at least one block among said plurality of first normal cell array blocks, said second partial memory cell array has said second spare cell array block and said plurality of second normal cell array blocks, and said second spare cell array block shares a sense amplifier with at least one block among said plurality of second normal cell array blocks, and said block access means is previously set not to simultaneously access said plurality of first normal cell array blocks and said plurality of second normal cell array blocks, for accessing said second spare cell array block in place of a defective block having a defective normal memory cell among said plurality of first normal cell array blocks and accessing said first spare cell array block in place of a defective block having a defective normal memory cell among said plurality of second normal cell array blocks.

4. The semiconductor memory device in accordance with claim 1, wherein said block access means reconstructs access conditions for a new accessed block group when said defective block is present, said new accessed block group including said accessed block group excluding said defective block and part of said initial unused block group.

5. A defect repair method for a semiconductor memory device, said semiconductor memory device comprising:

a memory cell array having a plurality of cell array blocks each being formed by dividing a plurality of memory cells, adjacent ones of said plurality of cell array blocks sharing sense amplifiers; and block access means for accessing a part of said plurality of cell array blocks excluding an initial unused block group as an accessed block group in an initial state while accessing a block in said initial unused block group having no possibility of competitively using said shared sense amplifier after replacement in place of a defective block having a defective memory cell being included in said accessed block group, wherein said plurality of memory cells include a plurality of normal memory cells and a plurality of spare memory cells, said plurality of cell array blocks include first and second spare cell array blocks being formed by dividing said plurality of spare memory cells and a plurality of normal cell array blocks each being formed by dividing said plurality of normal memory cells, said accessed block group includes said plurality of normal cell array blocks, and said initial unused block group includes said first and second spare cell array blocks, each of said first and second spare cell blocks share a sense amplifier with at least one block among said plurality of normal cell array blocks, and said block access means accesses one of said first and second spare cell array blocks having no possibility of competitively using said shared sense amplifier after replacement in place of a defective block having a defective normal memory cell among said plurality of normal cell array blocks, said defect repair method comprising steps of:
(a) testing whether or not said defective block is present in said plurality of normal cell array blocks;
(b) making a defectiveness/non-defectiveness test on said first and second spare cell array blocks when presence of said defective block is confirmed in said test at said step (a); and
(c) making change for accessing one block among said first and second spare cell array blocks in place of said defective block and carrying out defect repair when a determination of non-defectiveness is made in said defectiveness/non-defectiveness test at said step (b).

6. The defect repair method in accordance with claim 5, wherein said defectiveness/non-defectiveness test at said step (b) includes a test of determining non-defectiveness when no defective spare memory cell is present for a spare cell array block sharing no sense amplifier with said defective block among said first and second spare cell array blocks, and said change at said step (c) is change of accessing a block being subjected to said defectiveness/non-defectiveness test at said step (b) among said first and second spare cell array blocks in place of said defective block.

7. A semiconductor memory device comprising:

a memory cell array having a plurality of cell array blocks with adjacent ones of said plurality of cell array blocks sharing sense amplifiers; and block access means for accessing a first portion of said plurality of cell array blocks forming an accessed block group and at least two of said plurality of cell array blocks forming an initial unused block group, wherein said block access means only accesses one of the at least two cell array blocks in said initial unused block group as a replacement for a defective block if one of the cell array blocks in said accessed block group is indicated to be the defective block containing a defective memory cell, and wherein said one of the at least two cell array blocks in said initial unused block group being accessed as a replacement for the defective block is one having no possibility of sharing any of said shared sense amplifiers associated with the defective block.

8. The semiconductor memory device in accordance with claim 7, wherein said plurality of memory cells include a plurality of normal memory cells and a plurality of spare memory cells, said plurality of cell array blocks include first and second spare cell array blocks corresponding to said at least two of said plurality of cell array blocks forming the initial unused block group and a plurality of normal cell blocks corresponding to said first portion of said plurality of cell array blocks forming said accessed block group, wherein each of said first and second spare cell array blocks share one of said sense amplifiers with at least one cell array block among said plurality of normal cell array blocks, and said block access means accesses one of said first and second spare cell array blocks as said replacement for the defective block.

9. The semiconductor memory device in accordance with claim 8, wherein said memory cell array has first and second partial memory cell arrays, and said plurality of normal cell array blocks have a plurality of first normal cell array blocks and a plurality of second normal cell array blocks, said first partial memory cell array including said first spare cell array block and said plurality of first normal cell array blocks, wherein said first spare cell array block shares one of said sense amplifiers with at least one normal cell array block among said plurality of first normal cell array blocks, said second partial memory cell array including said second spare cell array block and said plurality of second normal cell array blocks, wherein said second spare cell array block shares one of said sense amplifiers with at least one normal cell array block among said plurality of second normal cell array blocks, and wherein said block access means accesses said second spare cell array block as said replacement for the defective block when said defective block is one having a defective memory cell among said plurality of first normal cell array blocks and accesses said first spare cell array block as said replacement for the defective block when said defective block is one having a defective memory cell among said plurality of second normal cell array blocks.

* * * * *